United States Patent
Andreev et al.

(10) Patent No.: US 8,629,548 B1
(45) Date of Patent: Jan. 14, 2014

(54) CLOCK NETWORK FISHBONE ARCHITECTURE FOR A STRUCTURED ASIC MANUFACTURED ON A 28 NM CMOS PROCESS LITHOGRAPHIC NODE

(71) Applicant: eASIC Corporation, Santa Clara, CA (US)

(72) Inventors: Alexander Andreev, San Jose, CA (US); Andrey Nikishin, Moscow (RU); Sergey Gribok, Santa Clara, CA (US); Phey-Chuin Tan, Penang (MY); Choon-Hun Choo, Perak (MY)

(73) Assignee: EASIC Corporation, Santa Clara, CA (US)

( * ) Notice: Subject to any disclaimer, the term of this patent is extended or adjusted under 35 U.S.C. 154(b) by 0 days.

(21) Appl. No.: 13/649,547

(22) Filed: Oct. 11, 2012

(51) Int. Cl.
*H01L 23/52* (2006.01)

(52) U.S. Cl.
USPC .................... 257/691; 438/618; 257/E23.153

(58) Field of Classification Search
USPC ................. 257/691, 776, E23.153, E23.168, 257/E23.178; 438/618
See application file for complete search history.

(56) References Cited

U.S. PATENT DOCUMENTS 6,657,130 B2 * 12/2003 Van Dyke et al. ............ 174/255

* cited by examiner

*Primary Examiner* — Quoc Hoang
(74) *Attorney, Agent, or Firm* — Suiter Swantz pc llo

(57) ABSTRACT

A clock architecture for a Structured ASIC chip, manufactured using a CMOS process is shown. A via-configurable logic block (VCLB) architecture in the Structured ASIC has a core region containing memory and logic cells arranged in columns that are supplied by a clock network having a global clock network tree and a low-level clock mesh to distribute the global clock signal in a repeating pattern. The clock mesh has a fishbone configuration in outline and allows for scalable expansion of the clock network. In one embodiment 36 global clocks may be provided to the Structured ASIC, with four clocks per logic cell. The VCLB Structured ASIC chip is manufactured on a 28 nm CMOS process lithographic node, having several metal layers but preferably is programmable on a single via layer.

20 Claims, 12 Drawing Sheets

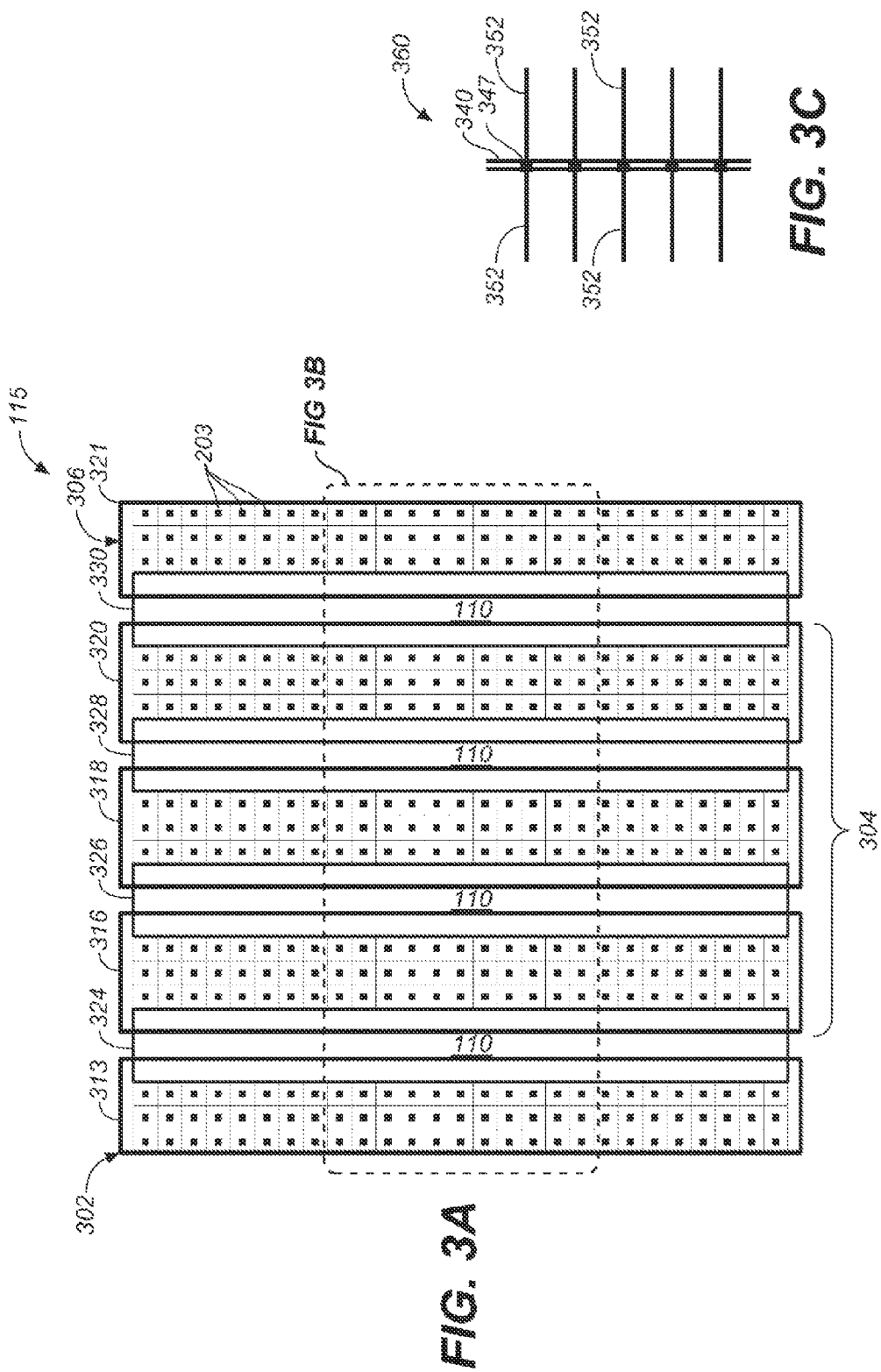

CLOCK NETWORK FISHBONE ARCHITECTURE FOR A STRUCTURED ASIC MANUFACTURED ON A 28 NM CMOS PROCESS LITHOGRAPHIC NODE

CROSS-REFERENCE TO RELATED APPLICATIONS

The present application is related to: U.S. application Ser. No. 13/649,510, for "VIA-CONFIGURABLE HIGH-PERFORMANCE LOGIC BLOCK INVOLVING TRANSISTOR CHAINS" by Andrew Andreev, Sergery Gribok, Ranko Scepanovic, Phey-Chuin TAN, Chee-Wei KUNG, filled the same day as the present invention, Oct. 11, 2012; U.S. application Ser. No. 13/649,529, for "ARCHITECTURAL FLOORPLAN FOR A STRUCTURED ASIC MANUFACTURED ON A 28 NM CMOS PROCESS LITHOGRAPHIC NODE OR SMALLER" by Alexander Andreev, Ranko Scepanovic, Ivan Pavisic, Alexander Yahontov, Mikhail Udovikhin, Igor Vikhliantsev, Chong-Teik LIM, Seow-Sung LEE, Chee-Wei KUNG, filed the same day as the present invention, Oct. 11, 2012; U.S. application Ser. No. 13/649,551, for MICROCONTROLLER CONTROLLED OR DIRECT MODE CONTROLLED NETWORK-FABRIC ON A STRUCTURED ASIC" by Alexander Andreev, Andrey Nikitin, Marian Serbian, Massimo Verita, filed the same day as the present invention, Oct. 11, 2012; U.S. application Ser. No. 13/649,563, for "TEMPERATURE CONTROLLED STRUCTURED ASIC MANUFACTURED ON A 28 NM CMOS PROCESS LITHOGRAPHIC NODE" by Alexander Andreev and Massimo Verita, filed the same day as the present invention, Oct. 11, 2012; U.S. application Ser. No. 13/649,584, for "DIGITALLY CONTROLLED DELAY LINE FOR A STRUCTURED ASIC HAVING A VIA CONFIGURABLE FABRIC FOR HIGH-SPEED INTERFACE" by Alexander Andreev, Sergey Gribok, Marian Serbian, Massimo Verita, Kee-Wei SIM, Kok-Hin LEW, filed the same day as the present invention, Oct. 11, 2012; and all assigned to the same Assignee as the present invention, all of which are specifically incorporated herein by reference.

BACKGROUND OF THE INVENTION

1. Field of Invention

The present invention relates generally to the field of Structured ASICs. Embodiments of the present invention relate to a clock for a Structured ASIC. A Structured ASIC is an ASIC (Application-Specific Integrated Circuit) having some premade elements that are manufactured once in a first manufacturing process and kept in inventory, then the elements are interconnected later, or customized by a customer, in a second manufacturing process by masks (mask-programmable) rather than making a circuit all at once as in a traditional ASIC. In a Structured ASIC the customization occurs by configuring one or more via layers between metal layers in the ASIC.

2. Description of Related Art

A configurable logic block (CLB) may be an element of field-programmable gate array (FPGA), structured ASIC devices, and/or other devices. CLBs may be configured, for example, to implement different random logic (from combinational logic, such as NANDs, NORs, or inverters, and/or sequential logic, such as flip-flops or latches).

Broadly defined, structured application-specific integrated circuits (ASICs) may attempt to reduce the effort, expense and risk of producing ASICs by standardizing portions of the physical implementation across multiple products. By amortizing the expensive mask layers of the device across a large set of different designs, the non-recurring engineering (NRE) for a customized ASIC seen by a particular customer, which are one-time costs that do not depend on the number of units sold, can be significantly reduced. There may be additional benefits to the standardization of some portion of mask set, which may include improved yield through higher regularity and/or reduced manufacturing time from tape-out to packaged chip.

ASICs can be broken down further into a full-custom ASIC, a Standard Cell-based ASIC (standard-cell), a Structured ASIC and a gate array ASIC. At the opposite end of an ASIC is a field-programmable gate array (FPGA), an integrated circuit designed to be configured by the customer or designer after manufacturing in the field using software commands rather than at a foundry or IC fab. Other non-ASICs include simple and complex PLDs (Programmable Logic Devices), and off-the-shelf small and medium scale IC components (SSI/MSI).

A full-custom ASIC customizes every layer in an ASIC device, which can have 10 to 15 layers, requiring in a lithography process 10 to 15 masks. Since the customized design of the ASIC occurs at the transistor level, and modern ASICs have tens if not hundreds of millions of transistors, a full-custom ASIC is typically economically feasible only for applications that required millions of units. An example of such an application is the cell phone digital modem or a flat panel television video processing device.

In a standard cell ASIC, circuits are constructed from pre-defined logic components known as cells. Designers work at the gate level, not the finer transistor level, simplifying the process. The fab manufacturing the device provides a library of basic building blocks that can be used in the cells, such as basic logic gates, combinational components (and-or-inverter, multiplexer, 1-bit full adder), and basic memory, such as D-type latch and flip-flop. A library of other function blocks such as adder, barrel shifter and random access memory (RAM) may also exist. While the layout of each cell in a standard cell is predetermined, the circuit itself has to be uniquely constructed by connecting all layers to one another and the cells within each layer in a custom manner, which takes time and effort.

A register is a standard component in an ASIC, and is a group of flip-flops that stores a bit pattern. Registers can hold information from components or hold state between iterations of a clock so that it can be accessed by other components, to allow I/O synchronization, handshaking data between clock domains, pipelining, and the like.

In a gate-array ASIC, the level of abstraction is one level higher than a standard cell, in that each building block in a gate array is from an array of predefined cells, known as a base cell, which resembles a logic gate. Since location and type of cell is predetermined, gate-array ASICs can be manufactured in advance in greater quantities and inventoried for use later. A circuit is manufactured by customizing the interconnect between these cells, which is done at the metal interconnect masks. As in gate level ASICs, typically 3 to 5 metal layers have to be customized to specify the interconnect required to complete the circuit, which simplifies the manufacturing process.

A synchronous digital system has a clock distribution network that defines a reference point for moving data within the system. A clock distribution network distributes the clock signals from a common point to all the elements in the system that need it. Generally clock signals are loaded with a great fanout, travel over comparatively great distances, and operate at the higher speeds than other signals within the synchronous system. Clock waveforms must be particularly clean and sharp. In addition, long global interconnect lines become significantly more resistive as line dimensions are decreased, and is one of the primary reasons for the increasing significance of clock distribution on synchronous performance. The control of any differences and uncertainty in the arrival times of the clock signals can limit the maximum performance of the entire system and create race conditions in which an incorrect data signal may latch within a register. The clock distribution network often takes a significant portion of the power consumed by a chip; furthermore, significant power can be wasted in transitions within blocks, when their output is not needed. Power may be saved by clock gating, which involves adding logic gates to the clock distribution tree, so portions of the tree can be turned off when not needed.

A complex field programmable device is a versatile non-ASIC, as the generic logic cells can sometimes be more sophisticated than ASIC cells, and the interconnect structure can be programmable in the field using software rather than at a fab using for example photolithographic masks. A complex field programmable device can be re-programmed to a different circuit in hours, rather than only being programmable once at a fab like an ASIC. A complex field programmable device can be broadly divided into two categories, a Complex Programmable Logic Device (CPLD) and a Field Programmable Gate Array (FPGA). The logic cell of a CPLD can be more complex than an FPGA, and has a D-type flip-flop and a programmable logic device semiconductor such as a PAL™ type programmable logic device semiconductor, with configurable product terms. The interconnect of a CPLD is more centralized, with fewer concentrated routing lines. A FPGA logic cell is smaller, with a D-type flip-flop and a small Look Up Table (LUT), a multi input and single output block that is widely used for logic mapping, or multiplexers for routing signals through the interconnect and logic cells. The interconnect structure in an FPGA tends to be more distributed and flexible than a CPLD, making it more ideal for more high capacity, complex devices. The FPGA design that defines a circuit is stored in RAM, so when the FPGA is powered off, the design for the circuit disappears. When the FPGA is powered back up, one must reload the circuit design from non-volatile memory.

A simple PLD, historically called a programmable logic device, is much more limited in application, as they do not have a general interconnect structure. Today these devices are relatively rare by themselves and are now used as internal components in an ASIC or CPLD. Likewise, off-the-shelf small and medium scale IC components (SSI/MSI) are rarely used anymore, as they are first generation devices such as the 7400 series transistor-transistor logic (TTL) manufactured by various companies used in the 1960s and 70s to build computers. These components are no longer supported by modern EDA (Electronic Design Automation) software and have very limited functionality.

A complex field programmable device can be thought of as a form of programmable logic fabric. One such programmable logic fabric is a SRAM programmable Look-Up Table (LUT) technology that forms the basis of Field Programmable Gate Arrays and Complex Programmable Logic Devices. The programmable fabric technology allows synthesis of a logic design described in a Hardware Description Language (HDL) to be synthesized on to the logic fabric in order to perform the required logic function. The logic fabric includes memory blocks, embedded multipliers, registers and Look-Up Table logic blocks. Interconnect between logic elements is also SRAM programmable. As the state of the SRAM is deleted when powered off, the function of the programmable logic fabric incorporating SRAM can be changed.

ASIC design flow as a whole is a complex endeavor that involves many tasks, as described further herein, such as: logic synthesis, Design-for-Test (DFT) insertion, Electric Rules Check (ERC) on gate-level netlist, floorplan, die size, I/O structure, design partition, macro placement, power distribution structure, clocks distribution structure, preliminary check, (e.g., IR drop voltage drop, Electrostatic Discharge (ESD)), placement and routing, parasitic extraction and reduction (parasitic devices), Standard Delay Format (SDF) timing data generated by EDA tools, various checks including but not limited to: static timing analysis, cross-talk analysis, IR drop analysis, and electron migration analysis.

At the first step in the ASIC design flow, the design entry step, the circuit is described, as in a design specification of what the circuit is to accomplish, including functionality goals, performance constraints such as power and speed, technology constraints like physical dimensions, and fabrication technology and design techniques specific to a given IC foundry. Further in the design entry step is a behavioral description that describes at a high-level the intended functional behavior of the circuit (such as to add two numbers for an adder), without reference to hardware. Next is a RTL (Register Transfer Language) structural description which references hardware, albeit at a high-level of abstraction using registers. RTL focuses on the flow of signals between registers, with all registers updated in a synchronous circuit at the same time in a given clock cycle, which further necessitates in the design flow that the clocks be synchronized and the circuits achieve timing constraints and timing closure. RTL description captures the change in design at each clock cycle. All the registers are updated at the same time in a clock cycle for a synchronous circuit. A synchronous circuit consists of two kinds of elements: registers and combinational logic. Registers have a clock, input data, output data and an enable signal port. Every clock cycle the input data is stored internally and the output data is updated to match the internal data. Registers, often implemented as flip-flops, synchronize the circuit's operation to the edges of the circuit clock signal, and have memory. Combinational logic performs all the logical functions in the circuit and it typically consists of logic gates. RTL is expressed usually in a Verilog or VHDL Hardware Description Language (HDL), which are industry standard language descriptions. A hardware description language (HDL) is a language used to describe a digital system, for example, a network switch, a memory or a flip-flop. By using a HDL one can describe any digital hardware.

A design flow progresses from logical design steps to more physical design steps. Throughout this flow timing is of critical importance and must be constantly reassessed so that timing closure is realized throughout the circuit, since timing between circuits could change at different stages of the flow. Furthermore, the circuit must be designed to be tested for faults. The insertion of test circuitry can be done at the logic synthesis step, where register transfer level (RTL), is turned into a design implementation in terms of logic gates such as a NAND gate. Thus logic synthesis is the process of generating a structural view from the RTL design output using an optimal number of primitive gate level components (NOT, NAND, NOR, and the like) that are not tied to a particular device technology (such as 32 nm features), nor do with any information on the components' propagation delay or size. In logical synthesis the circuit can be manipulated with Boolean algebra. Logical synthesis may be divided into two-level synthesis and multilevel synthesis. Because of the large number of fan-ins for the gates (the number of inputs to a gate), two-level synthesis employs special ASIC structures known as Programmable-Logic Arrays (PLA) and modified Programmable Array Logic (PAL)-based CPLD devices. Multi-level synthesis is more efficient and flexible, as it eliminates the stringent requirements for the number of gates and fan-ins in a design, and is preferred. The multilevel synthesis implementation is realized by optimizing area and delay in a circuit. However, optimizing multilevel synthesis logic is more difficult than optimizing two-level synthesis logic, and often employs heuristic techniques.

Functional synthesis is performed at the design entry stage to check that a design implements the specified architecture. Once Functional Verification is completed, the RTL is converted into an optimized gate level netlist, using smaller building blocks, in a step called Logic Synthesis or RTL synthesis. In EDA this task is performed by third party tools. The synthesis tool takes an RTL hardware description and a standard cell library for a particular manufacturer as input and produces a gate-level netlist as output. The standard cell library is the basic building block repository for today's IC design. Constraints for timing, area, speed, testability, and power are considered. Synthesis tools attempt to meet constraints by calculating the engineering cost of various implementations. The tool then attempts to generate the best gate level implementation for a given set of constraints, target the particular manufacturing process under consideration. The resulting gate-level netlist is a completely structural description with only standard cells at the "leaves" of the design. At logical/RTL synthesis it is also verified whether the Gate Level Conversion has been correctly performed by performing simulation. The netlist is typically modified to ensure any large net in the netlist has cells of proper drive strength (fan out), which indicates how many devices a gate can drive. A driving gate can be any cell in the standard cell library. During compilation of the netlist the EDA tool many adjust the size of the gate driving each net in the netlist so that area and power is not wasted in the circuit by having too large of a drive strength. Buffer cells are inserted when a large net is broken into smaller sections by the EDA tool.

Throughout the logical design state, an EDA tool performs a computer simulation of the layout before actual physical design.

The next step in the ASIC flow is the physical Implementation of the gate level netlist, or physical design, such as system partitioning, floorplanning, placement and routing. The gate level netlist is converted into a geometric representation of the layout of the design. The layout is designed according to the design rules specified in the library for the fab that is to build the digital device. The design rules are guidelines based on the limitations of the fabrication process.

The Physical Implementation step consists of several sub steps: system partitioning, floorplanning, placement and routing. These steps relating to how the digital device is to be represented by the functional blocks, as one ASIC or several (system partitioning), how the functional blocks are to be laid out on one ASIC (floorplanning) and how the logic cells can be placed within the functional blocks (placement) and how these logic cells are to be interconnected with wiring (routing). The file produced at the output of this Physical Implementation is the so-called GDSII file, which is the file used by the foundry to fabricate the ASIC.

Floorplanning involves inputting into a floorplanning tool a netlist that describes the interconnection of ASIC blocks (RAM, ROM, ALU, cache controller, and the like); the logic cells (NAND, NOR, D flip-flop, and so on) within the blocks; and the logic cell connectors (e.g., terminals, pins, or ports). Floorplanning maps the logical description as found in the netlist to the physical description, the floorplan.

The goals of floorplanning are to arrange the ASIC blocks on the silicon chip, to decide the location of the I/O pads, to decide the location and number of the power pads, the type of power distribution, and the location and type of clock distribution. Design constraints in floorplanning include minimizing the silicon chip area and minimizing timing delay. Delay is often estimated from the total length of the interconnect and from an estimate of the total capacitance. Interconnect length and predicted interconnect capacitance is estimated from statistics of previously routed chips, including such factors as net fanout and block size of the circuits in the ASIC.

For any design to work at a specific speed, timing analysis has to be performed throughout the ASIC design flow. One must check using a Static Timing Tool in EDA whether the design is meeting the speed requirements of the specification. Industry standard Static Timing tools include Primetime (Synopsys), which verifies the timing performance of a design by checking the design for all possible timing violations caused by the physical design process.

During placement, for example, timing is effected since the length of an interconnect caused by placement changes the capacitance of the interconnect and hence changes the delay in the interconnect. The goal of an EDA placement tool is to arrange all the logic cells within the flexible blocks on a chip to achieve objectives such as: guarantee the router can complete the routing step, minimize all the critical net delays, make the chip as dense as possible, minimize power dissipation, and minimize cross talk between signals. Modern EDA placement tools use even more specific and achievable criteria than the above. The most commonly used placement objectives are one or more of the following: minimize the total estimated interconnect length, meet the timing requirements for critical nets, and minimize the interconnect congestion.

Algorithms for placement do exist, for example, the minimum rectilinear Steiner tree (MRST) is the shortest interconnect using a rectangular grid. The determination of the MRST is in general a NP-complete problem—which is difficult to solve in a reasonable time. For small numbers of terminals heuristic algorithms exist, but they are expensive in engineering cost to compute. Several approximations to the MRST exist and are used by EDA tools.

In the routing step, the wiring between the elements is planned. A Structured ASIC cross-section has metal layers; in a standard cell ASIC there may be nine metal layers, but in many structured ASICs not all metal layers need be for routing, and some layers may be pre-routed, and only the top layers are used for routing. This reduces the complexity of the manufacturing process, since non-recurring engineering costs are much lower, as photolithographic masks are required only for the fewer metal layers not for every layer, and production cycles are much shorter, as metallization is a comparatively quick process. The metal layers may be interconnected with one another at select vertical holes called vias that are filled with metal or some conductive material, called the 'via' layer, 'via connection layer' or 'via metal layer', and thus be configurable at this layer, or 'via configurable'. If the logic fabric comprising the Structured ASIC is configured with traditional IC optical lithography involving photolithographic masks, it can be thought of as "mask programmable". The mask for a Structured ASIC is programmed at the vias, and when the Structured ASIC employs via-configurable logic blocks it can be termed a via-configurable logic block (VCLB) architecture. The configuration and programmability of the VCLB architecture of the Structured ASIC may be performed by changing properties of so-called "configurable vias"—connections between VCLB internal nodes. A configurable or programmable via may be in one of two possible states: it may be either enabled or disabled. If a programmable via is enabled, then it can conduct a signal (i.e., the via exists and has low resistance). If a via is disabled, then it cannot practically conduct a signal, i.e., the via has very high resistance or does not physically exist. In some designs, such as by the present assignee to this invention, eASIC Corporation, the customizable metallization layers may be reduced to a few or even a single via layer where the customization is performed, see by way of example and not limitation U.S. Pat. No. 6,953,956, issued to eASIC Corporation on Oct. 11, 2005; U.S. Pat. No. 6,476,493, issued to eASIC Corporation on Nov. 5, 2002; and U.S. Pat. No. 6,331,733, issued to eASIC Corporation on Dec. 18, 2001; all incorporated herein by reference in their entirety. Further, a single via layer could be customized without resorting to mask-based optical lithography, but with a maskless e-beam process, as taught by the '956 patent.

During circuit extraction and post layout simulation, a back-annotated netlist is used with timing information to see if the physical design has achieved the objectives of speed, power and the like specified for the design. If not, the entire ASIC design flow process is repeated. In modern EDA tools the delays calculated from a simulation library of library cells used in the design, during physical design steps, are placed in a special file called the SDF (Synopsys Delay Format) file. Each cell can have its own delay based on where in the netlist it is found, what are its neighboring cells, the load on the cell (load in general may be resistive, inductive or capacitive), the fan-in, and the like. Each internal path in a cell can have a different propagation time for a signal, known as a timing arc. The maximum possible clock rate is determined by the slowest logic path in the circuit, called the critical path.

Compounding the problem of delay is that in a synchronous ASIC one must avoid clock skew, and different parts of the ASIC may have different clock domains controlling them, with the wiring nets that establish the clock signal forming a clock net branching out in the form of a clock tree. The clock tree can have a top node and underlying branch or leaf nodes. Establishing this tree, which often requires additional circuitry like buffer cells to help drive the massive clock tree, is called clock tree synthesis. As an ASIC is a synchronous circuit, all the clocks in the clock tree must be in synch and chip timing control achieved, typically by using Phase-Locked Loops (PLLs) and/or Delay-Locked Loops (DLLs). If the clock signal arrives at different components at different times, there is clock skew. Clock skew can be caused by many different things, such as wire-interconnect length, temperature variations and differences in input capacitance on the clock inputs of devices using the clock. Further, timing must satisfy register setup and hold time requirements. Both data propagation delay and clock skew play important parts in these calculations. Problems of clock skew can be solved by reducing short data paths, adding delay in a data path, clock reversing and the like. Thus during the physical synthesis steps, clock synthesis is an important step, which distributes the clock network throughout the ASIC and minimizes the clock skew and delay.

Finally, IP in the form of proprietary third party functionality such as a semiconductor processor may be embedded in an ASIC using soft macros, firm macros and hard macros that can be bought from third parties. A soft macro describes the IP as RTL code and does not have timing closure given the design specification nor layout optimization for the process under consideration. However, as RTL code a soft macro can be modified by a designer with EDA tools and synthesized into the designer's library. By contrast, a hard macro is timing-guaranteed and layout-optimized for a particular design specification and process technology but is not portable outside the particular design and process under consideration, but is not represented in RTL code; rather a hard macro is tailored for a particular foundry and closer to GDSII layout. A firm macro falls between a hard macro and a soft macro. Firm macros are in netlist format, are optimized for performance/area/power using a specific fabrication technology, are more flexible and portable than hard macros, and more predictive of performance and area to be used than soft macros. Macros obviate a designer having to design every component from scratch, and are a great time saver. Third party designers favor firm and hard macros since it is easier to hide intellectual property (IP) present in such macros than it is to hide such IP in a soft macro.

Given the above, the pros and cons of standard cell ASICs versus a complex field programmable device such as an FPGA is as follows. The advantages of FPGAs are that they can be easy to design, have shorter development times and thus are faster in time-to-market, and have lower NRE costs. These are also the disadvantages of standard cell ASICs: they can be difficult to design, have longer development times, and higher NRE costs. The disadvantages of FPGAs are that design size is limited to relatively small production designs, design complexity is limited, performance is limited, power consumption is high, and there is a high cost per unit. These FPGA disadvantages are standard-cell advantages, as standard cells support large and complex designs, have high performance, low power consumption and low per-unit cost at a high volume.

A Structured ASIC falls between an FPGA and a Standard Cell-based ASIC in classification and performance. Structured ASIC's are used for mid-volume level designs. In a Structured ASIC the task for the designer is to map the circuit into a fixed arrangement of known cells.

Structured ASICs are closer to standard-cells in their advantages over FPGAs. The disadvantage of structured ASICs compared to FPGAs is that FPGAs do not require any user design information during manufacturing. Therefore, FPGA parts can be manufactured in larger volumes and can exist in larger inventories. FPGAs can also be modified after their initial configuration, which means that design bugs can be removed without requiring a fabrication cycle. Design improvements can be made in the field, and even done remotely, which removes the requirement of a technician to physically interact with the system. Given these pros and cons, structured ASICs combine the best features of FPGAs and standard cell ASICS.

Structured ASIC advantages over standard cell ASICs and FPGAs include that they are largely prefabricated, with components are that are almost connected in a variety of pre-defined configurations and ready to be customized into any one of these configurations. Fewer metal layers are needed for fabrication of a Structured ASIC, which dramatically reduces the turnaround time. Structured ASICs are easier and faster to design than standard cell ASICs. Multiple global and local clocks are prefabricated in a Structured ASIC. Consequently, there are no skew problems that need to be addressed by the ASIC designer. Thus signal integrity and timing issues are inherently addressed, making design of a circuit simpler and faster. Capacity, performance, and power consumption in a Structured ASIC is closer to that of a standard cell ASIC. Further, structured ASICs have faster design time, reduced NRE costs, and quicker turnaround than standard cell ASICs.

Thus with structured ASICs the per-unit cost is reasonable for several hundreds to 100 k unit production runs.

A technology comparison between standard cell ASICs, structured ASICs, and FPGAs, respectively, is roughly as follows: generally speaking, and these ratios can change year-by-year and with different process lithographic nodes, there is a ratio of 100:33:1 between the number of gates in a given area for standard cell ASIC's, structured ASICs, and FPGAs, respectively; a ratio of 100:75:15 for performance (based on clock frequency); and a ratio of 1:3:12 for power.

Compared to a field-programmable gate array (FPGA), the unit price of a Structured ASIC solution may be reduced by an order of magnitude due to the removal of the storage and logic required for configuration storage and implementation. The unit cost of a Structured ASIC may be somewhat higher than a full custom ASIC, primarily due to the imperfect fit between design requirements and a standardized base layer, with certain I/O, memory and logic capacities.

Structured ASIC products may be differentiated by the point at which the user customization occurs and how that customization is actually implemented. Most structured ASICs may only standardize transistors and the lowest levels of metal. A large set of metal and via masks may be needed in order to customize a product. This yields a marginal cost reduction for NRE. Manufacturing latency and yield benefits may also be compromised using this approach.

An ideal ASIC device may combine the field programmability of FPGAs with the power and size efficiency of ASICs or structured ASICs.

A System-in-Package (SiP) are multiple bare dice and/or chip-scale package (CSP) devices, each implementing their own function (e.g., analog, digital, and radio frequency (RF) dice) that are mounted on a SiP common substrate, which is used to connect them together. The substrate and its components are then placed in (or built into) a single package, called an IC (Integrated Circuit) or SiP, which is a traditional two-dimensional (2D) chip. A 2.5D IC/SiP is different from a traditional 2D IC/SiP, and in one type of 2.5D IC a silicon interposer is placed between the SiP common substrate and the dice, where this silicon interposer has through-silicon vias connecting the metallization layers on the upper and lower surfaces of the silicon interposer. The multiple bare dice can be attached to the silicon interposer using micro-bumps, which are about ~10 um in diameter, and in turn the silicon interposer is attached to the SiP substrate using regular flip-chip bumps, which can be ~100 um in diameter. Further, a 3D IC/SiP configuration enable designers to achieve higher levels of integration by allowing multiple die to be stacked vertically on top of one another. Wire bonds connect a topmost die with an underlying SiP substrate and allow the topmost die to communicate with a SiP substrate that is covered by an underlying die.

A FET (Field Effect Transistor) is a transistor that uses an electric field to control the conductivity of a charge carrier channel in a semiconductor. A common type of FET is the Metal Oxide Semiconductor FET (MOSFET). MOSFET work by inducing a conducting channel between two contacts called the source and the drain by applying a voltage on the oxide-insulated gate electrode. Two types of MOSFET are called nMOSFET (commonly known as nMOS or NFET) and pMOSFET (commonly known as pMOS or PFET) depending on the type of carriers flowing through the channel. A nMOS transistor is made up of n-type source and drain and a p-type substrate. The three modes of operation in a nMOS are called the cut-off, triode and saturation. nMOS logic is easy to design and manufacture, but devices made of nMOS logic gates dissipate static power when the circuit is idling, since DC current flows through the logic gate when the output is low. By contrast, a pMOS transistor is made up of p-type source and drain and a n-type substrate. PMOS technology is low cost and has a good noise immunity. In a nMOS, carriers are electrons, while in a pMOS, carriers are holes; since electrons travel faster than holes, all things being equal NFETs are twice as fast as PFETs. When a high voltage is applied to the gate, with the gate-source voltage exceeding some threshold value ($V_{GS}>V_{TH}$), the nMOS will conduct, while pMOS will not; and conversely when a low voltage is applied in the gate, nMOS will not conduct and pMOS will conduct. PFETs are normally closed switches and NFETs are normally open switches. PFETs often occupy more silicon area than NFETs when forming logic blocks. pMOS devices are more immune to noise than nMOS devices. Furthermore, nMOS ICs are smaller than pMOS ICs with the same functionality, since the nMOS can provide one-half of the impedance provided by a pMOS under the same geometry and operating conditions.

Complementary metal-oxide-semiconductor (CMOS) is a technology for constructing integrated circuits. CMOS is sometimes referred to as complementary-symmetry metal-oxide-semiconductor (or COS-MOS). The words "complementary-symmetry" refer to the fact that the typical digital design style with CMOS uses complementary and symmetrical pairs of p-type and n-type metal oxide semiconductor field effect transistors (MOSFETs) for logic functions. Complementary Metal-Oxide-Silicon circuits require an nMOS and pMOS transistor technology on the same substrate. An n-type well is provided in the p-type substrate. Alternatively one can use a p-well or both an n-type and p-type well in a low-doped substrate. The gate oxide, poly-silicon gate and source-drain contact metal are typically shared between the pMOS and nMOS technology, while the source-drain implants are done separately. Since CMOS circuits contain pMOS devices, which are affected by the lower hole mobility, CMOS circuits are not faster than their all-nMOS counter parts. Even when scaling the size of the pMOS devices so that they provide the same current, the larger pMOS device has a higher capacitance.

The CMOS advantage is that the output of a CMOS inverter can be as high as the power supply voltage and as low as ground. This large voltage swing and the steep transition between logic levels yield large operation margins and therefore also a high circuit yield. In addition, there is no power dissipation in either logic state. Instead the power dissipation occurs only when a transition is made between logic states. CMOS circuits are therefore not faster than nMOS circuits but are more suited for very/ultra large-scale integration (VLSI/ULSI).

A further problem in a Structured ASIC is that any clock or clock network, which may drive PLLs, DLLs, random logic, memory, IOs and high-speed IOs like SerDes (Serializer/Deserializer) and other components, needs to be both scalable to easily be placed on a Structured ASIC chip as the chip changes in size, easy to work with for a customer using the ASIC, relatively free of skew and glitches and relatively easy to manufacture.

SUMMARY OF THE INVENTION

Accordingly, an aspect of the present invention is to provide an improved clock network for a Structured ASIC, manufactured using a CMOS process using NFET/nMOS and PFET/pMOS transistors, which includes a via-configurable logic block (VCLB) architecture. VCLB configuration may be performed by changing properties of so called "configurable vias"—connections between VCLB internal nodes.

Another aspect of the present invention is to provide a scalable clock network that is used in a Structured ASIC core that has memory and logic.

Another aspect of the present invention is to provide a clock tree that has a low-level clock mesh of a beneficial fishbone construction.

Still another aspect of the present invention is for a low level fishbone-like architecture that is preconfigured to be balanced, having a repeating pattern, which can help achieve timing closure for any circuit design potentially faster.

Another aspect of the present invention is to provide a first layout for a clock macro of the clock network that is made for servicing logic cells in a VCLB Structured ASIC.

Another aspect of the present invention is to provide a second layout for a clock macro of the clock network that is made for servicing memory cells in a VCLB Structured ASIC.

Another aspect of the present invention is to provide a clock network in a VCLB Structured ASIC as described herein that is manufactured on a 28 nm CMOS process lithographic node or smaller.

Yet another aspect of the present invention is to provide via configurable metal layers for the Structured ASIC semiconductor device described herein that are configurable in a single via layer.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

FIG. 3A shows the core of the Structured ASIC of the present invention.

FIG. 3C is a stylized representation of the "fishbone" design of the low level clock mesh.

Figure 1:
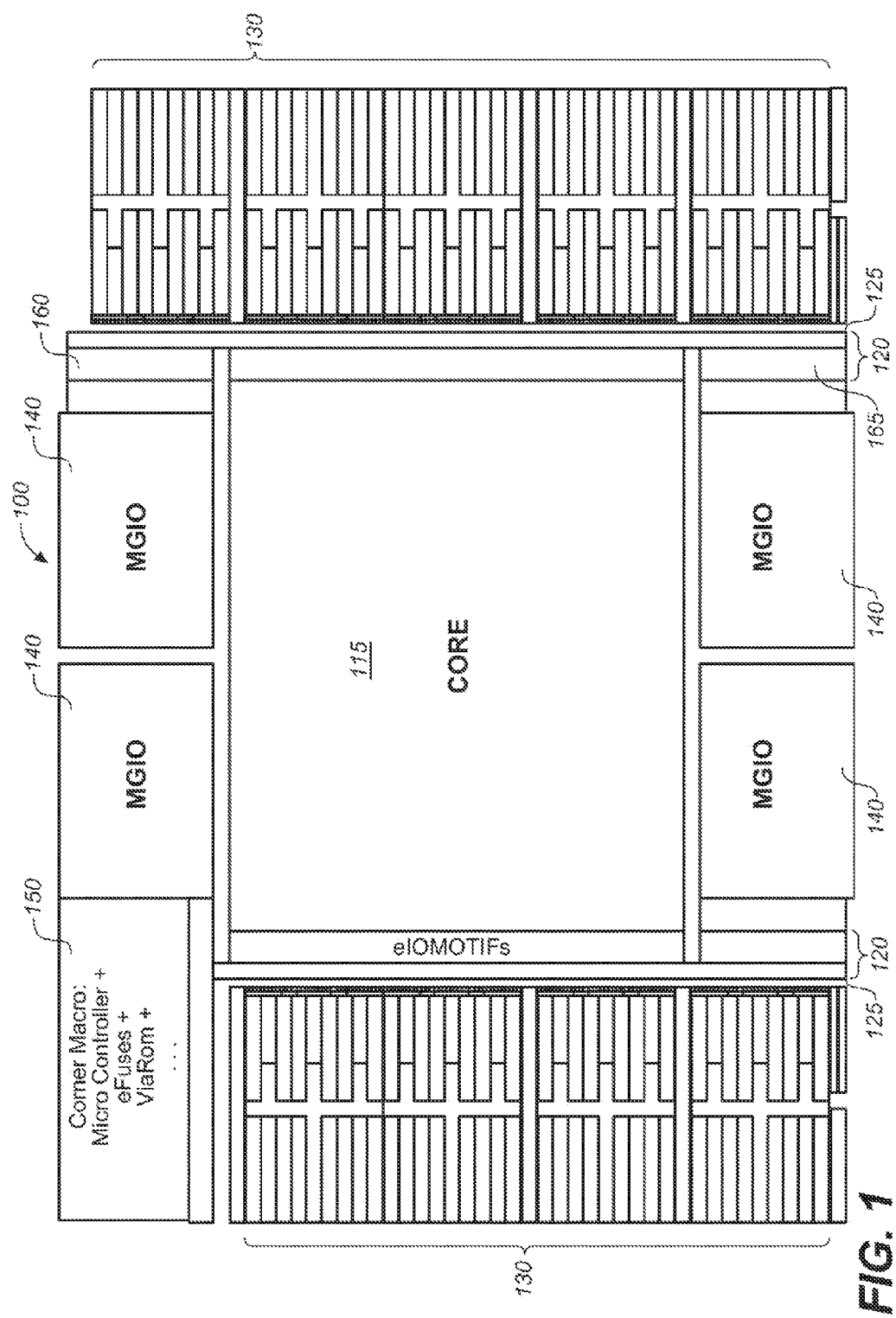
FIG. 1 is a schematic of the generalized floor plan architecture of the Structured ASIC in which the clock network of the present invention appears.

It should be understood that one skilled in the art may, using the teachings of the present invention, vary embodiments shown in the drawings without departing from the spirit of the invention herein. In the figures, elements with like numbered reference numbers in different figures indicate the presence of previously defined identical elements.

DETAILED DESCRIPTION OF THE INVENTION

The method and apparatus of the present invention may be described in software, such as the representation of the invention in an EDA tool, or realized in hardwire, such as the actual physical instantiation.

Regarding the floorplan of the present invention, the drawings sometimes show elements as blocks that in a physical implementation may differ from this stylized representation, but the essential features of the floorplan should be apparent to one of ordinary skill in the art from the teachings herein. The exact placement of the blocks vis-à-vis neighboring blocks can vary in an actual chip from the simple stylized representations as shown in the figures, and in addition there may be several layers in an ASIC chip that achieve the functionality shown, superimposed on one another, and not necessarily a single layer as shown in the drawings. This is true for most of the elements in the present invention, as understood by one of ordinary skill, and that does not detract from any of the teachings of the present invention.

The elements in the floor plan of the present invention are operatively connected to one another where necessary, as can be appreciated by one of ordinary skill in the art from the teachings herein. As can be appreciated by one of ordinary skill, a conducting path is operatively connected to another conducting path even though there may be an intervening element between the two paths, such as a register or buffer.

According to an embodiment of the invention, there in shown in FIG. 1 a schematic of the generalized floor plan architecture of the Structured ASIC in which the clock network of the present invention appears. A Structured ASIC chip 100 is shown, code named RUBY, which is an ASIC having some pre-made elements that are mask-programmable or customized later by a customer rather than all at once as in a traditional ASIC, with the customization occurring by configuring one or more via layers between metal layers. The Structured ASIC has logic unit blocks 203 (see FIG. 2C, FIG. 3A and FIG. 6), called eMotif logic cell modules 203, and memory cells 110 forming a rectilinear core 115. The memory is comprised of BRAM (Block RAM) in 512 kb×18 bits, with an extra bit forming a repair bit. The logic cell module blocks 203 and the memory blocks 110, formed of BRAM, together comprising the logic and memory core 115 of chip 100. The logic and memory alternate in a repeating pattern of columns in substantially rectilinear shaped core 115 as shown in FIG. 1, with the axis of the columns aligned along a vertical, north-south axis or direction to the core. The logic cell modules 203 also are grouped in rows that cooperate with neighboring blocks of memory from memory blocks 110. There is an IO region 130 on the left and right sides of the chip 100, servicing the core 115 comprising the logic cell blocks 105 formed into logic cell modules 203, containing in their center a clock macro of the present invention, and the memory cells 110. A second IO fabric region area 120 exists that defines a region for a second connection fabric. The dimensions of the second routing fabric across IO region 120 can be about 750 microns, compared to the eMotif logic array which can be about 50 microns square. BIST (Built-In Self Test) circuitry 125 also exists in the chip 100. A BIST fabric 125 is for test and global connections, and is part of a network fabric termed eIOMotif 160 (also shown in the drawing of FIG. 1 as "eIOMOTIFs") that connects to a microcontroller and can operative surround the entire periphery of the core 115. EIOMotif can be deemed a configurable block located between the IOs to the core and the core 115. EIOMotif fabric 160 is used to implement timing critical parts of high-speed IO-interfaces. The routing fabric eIOMotif 160 may reside on metal layers 6, 7 and 8 (M6/M7/M8), separate from but parallel to the other planes comprising the chip 100. Within the core 115 there is additional routing to connect the logic blocks 203 and memory cells 110 as need be, operatively connected to the IO circuitry at the periphery of the core 115 both with IO region 130 and the second connection fabric eIOMotif 160.

Within and throughout the core region 115 there is a clock network, which comprises clock network that connects to one or more global clocks, a plurality of regional clocks connected to the global clock(s), and peripheral clocks used for activities such as testing. These clocks have clocks trees comprising conductive signal lines for the clock signals to travel on, along with circuitry such as buffer cells operatively attached to the trees to drive and manage the clock signals in the trees. Ideally the clock trees are symmetrical, since a signal that is split along a symmetrical path of a tree having two branches of identical geometric shape will take the same amount of time to travel from the root to the leaves of the tree, all things being equal. However, this is sometimes not possible, and a tree is not symmetrical, so the tree has to be balanced electrically to prevent a signal being skewed as it travels along the asymmetrical tree. FIGS. 2A-2D illustrate the concept of balancing clock trees in certain cases.

Figure 2B:
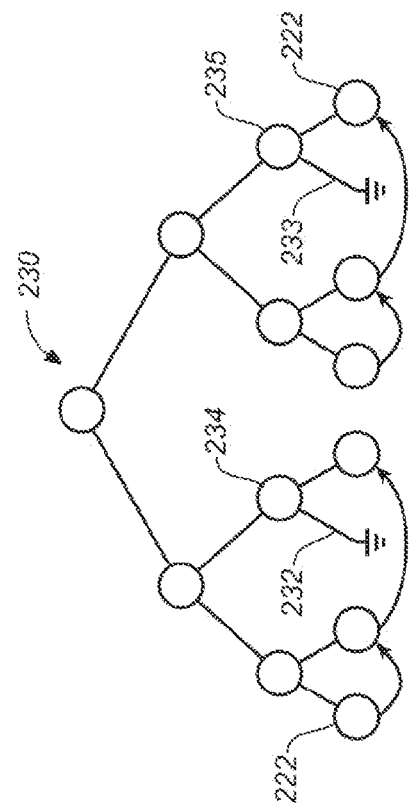
FIGS. 2A and 2B are schematic clock network trees in two idealized cases.
Figure 2A:
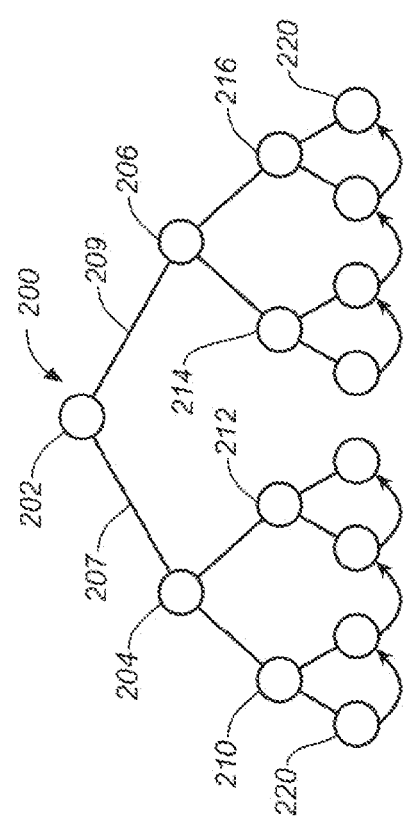

In FIG. 2A, a symmetrical, balanced global clock tree 200 is shown having a parent top root node 202, and child leaf nodes 204, 206 at a first level along branches 207, 209 and child leaf nodes 210, 212, 214, 216 at a second level, with the tree being symmetrical along the left and right branches 207, 209 as shown. A clock signal propagating from the top of the global clock tree at node 202 will have no skew when it reaches the bottom leaf nodes 220. However, the number of nodes at each branch level has to be $2^N$ power, with N=0, 1, 2, 3 . . . thus the nodes are 1, 2, 4, 8, 16 and so on. Thus if you have eight nodes at the bottom the tree can be made symmetrical, as shown in FIG. 2A, but in a general case you may have only six nodes, as illustrated in FIG. 2B, at nodes 222 at the bottom of the unbalanced global clock tree 230. In this more general case the unbalanced global clock tree 230 can be made balanced for clock signal purposes by adding truncated branches 232, 233 to electrically balance the tree and simulates a perfectly balanced tree. This is shown by a ground symbol at branches 232, 233 of nodes 234, 235 of the geometrically unbalanced tree 230, which, through the judicious adding of load, dummy load, buffers, delay and the like to produce balancing and useful skew at branches 232, 233 makes the unbalanced tree 230 electrically equivalent, for clock signaling purposes, to the balanced tree 200, and thus the geometrically unbalanced tree 230 becomes electrically balanced and is considered by designers a balanced tree.

Figure 2C:
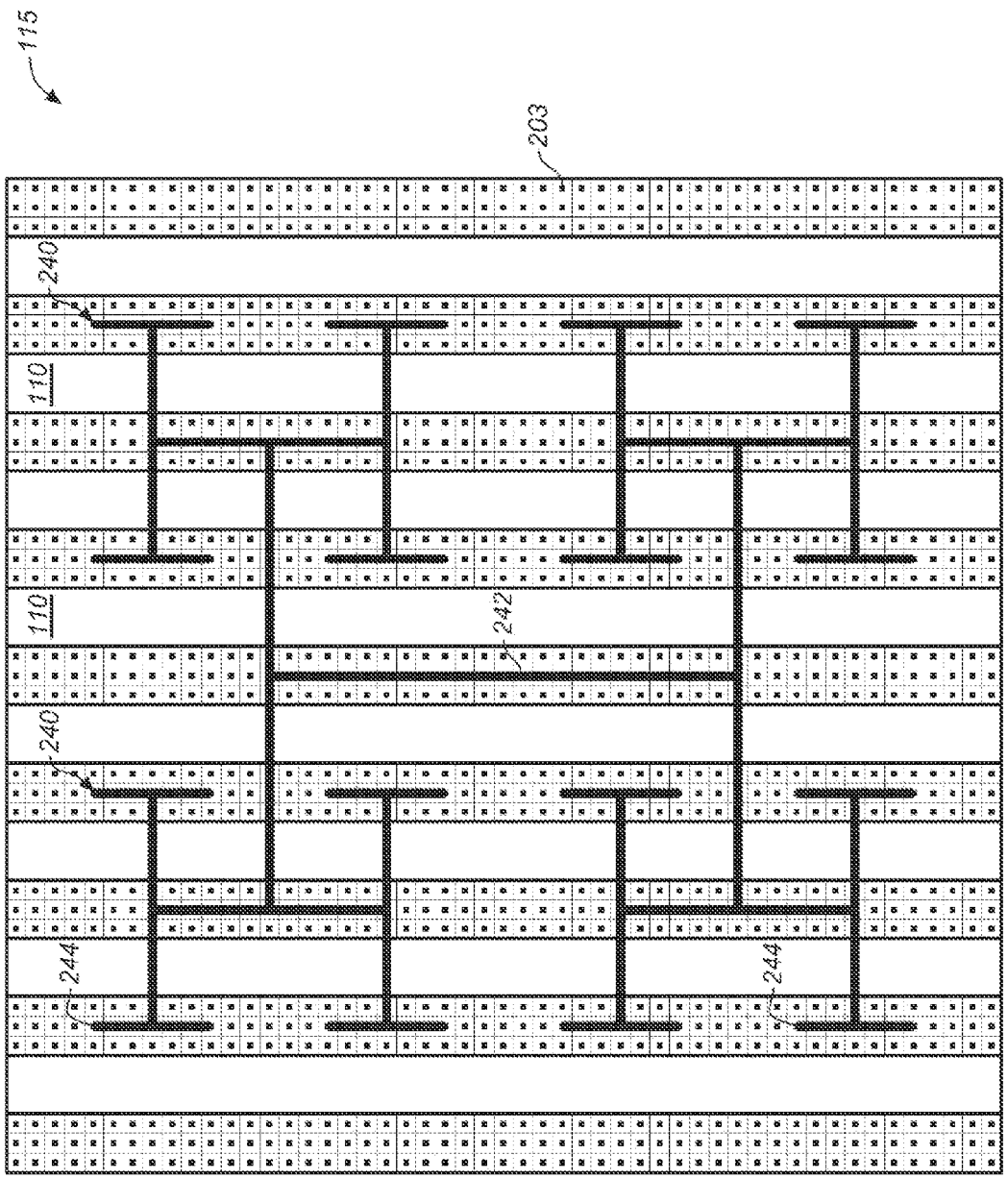
FIGS. 2C and 2D are two global clock trees showing a "perfect" H-tree case and a more general case.
Figure 2D:
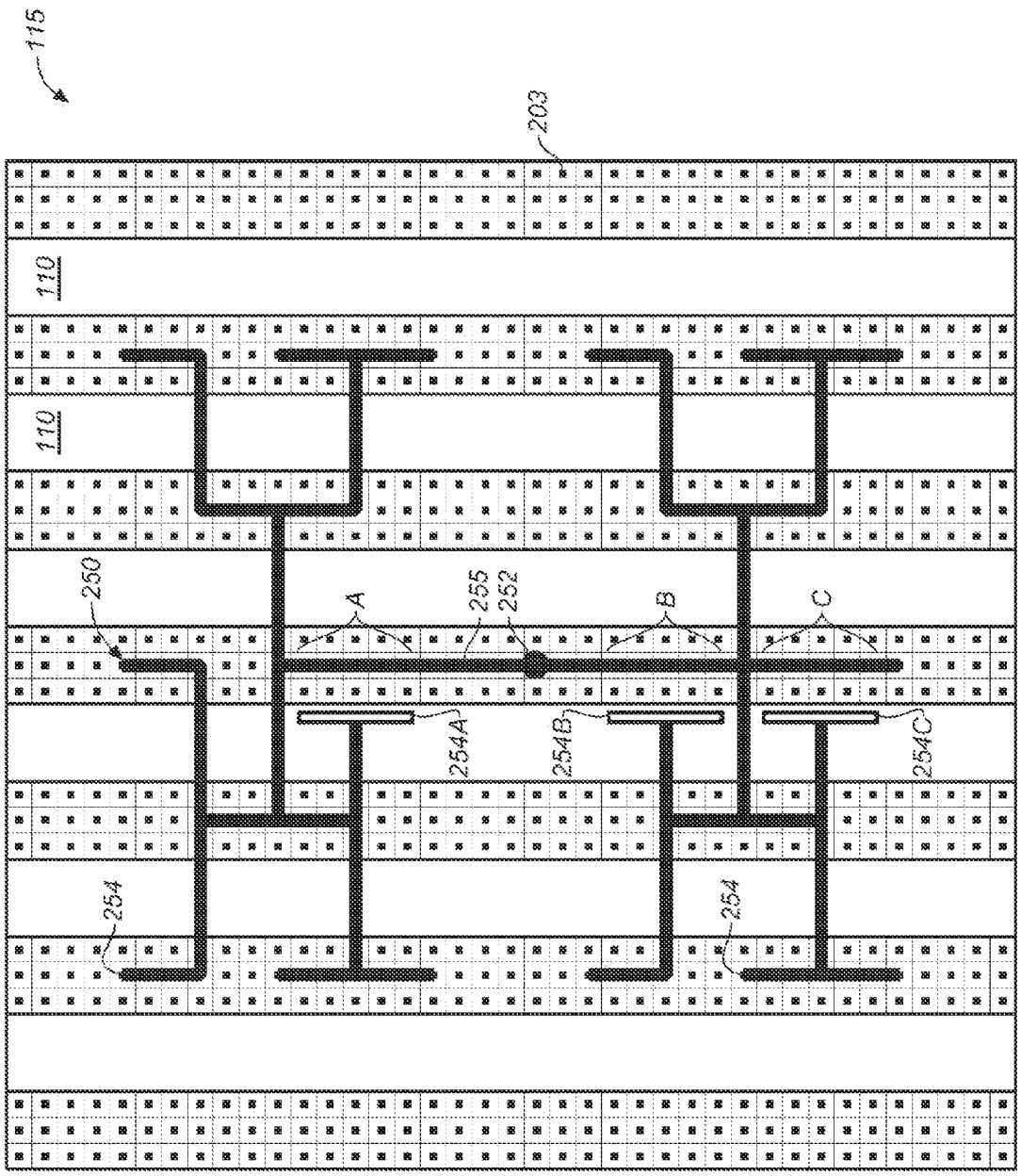

An example of this balancing in practice is shown in FIGS. 2C and 2D. In FIGS. 2C and 2D, two global clock trees 240 and 250 are shown routed in the core 115 comprised of logic cell blocks 203 and memory blocks 110 comprised of BRAM. In FIG. 2C, the first global clock tree 240 is a balanced H-like tree, drawn with a darkened thick line, having a top node 242 in the geometric center of the tree and children nodes 244. It requires an even number of memory blocks 110 in order to layout and is perfectly symmetrical in all directions about the top parent root node 242, as can be seen. This global tree is naturally balanced. In FIG. 2D, a more general case, the global clock tree 250 is disposed between an even number of BRAM blocks 110 and is unsymmetrical in all directions about the top node 252 having children nodes 254 at the extremities. This global tree is naturally unbalanced from a geometric point of view. However, balanced clock tree 250 may be balanced electrically through the judicious introduction of buffers, load, dummy load and the like to produce balancing and useful skew, and is somewhat symmetrical as shown. The top node 252 is in the middle and shown conceptually as a black dot since this is where the clock vias come out of the plane of the paper in FIG. 2D (normal to the paper) and are distributed by the clock in a planar manner in the plane of the paper as shown. When completed, the tree of FIG. 2D is balanced electrically and equivalent to the naturally balanced tree of FIG. 2C. In this way, a structured ASIC made in accordance with the present invention can greatly eliminate problems associated with balancing trees in other types of traditional ASICs. Further, as indicated by the hollow lines defined by segments 254A, 254B and 254C, these child node portions would overlie the portion of vertically lying trunk line 255 at portions defined by lengths A, B and C, with child node segment 255A overlying (i.e., superimposed on) portion A on the trunk line 255, child node segment 255B overlying portion B, and child node segment 255C overlying portion C on line 255. To achieve this superposition without shorting, an insulator disposed in-between and/or different metal layers for the overlying areas can be used to prevent cross-signal contamination and touching, but the geometry of the clock is otherwise as shown in FIG. 2D. This superposition of these vertical segments of the clock tree is also true for the trees in FIG. 2E, as indicated in the drawings conceptually with hollow portions, and not shown for all trees to prevent crowding in the drawing.

Figure 2E:
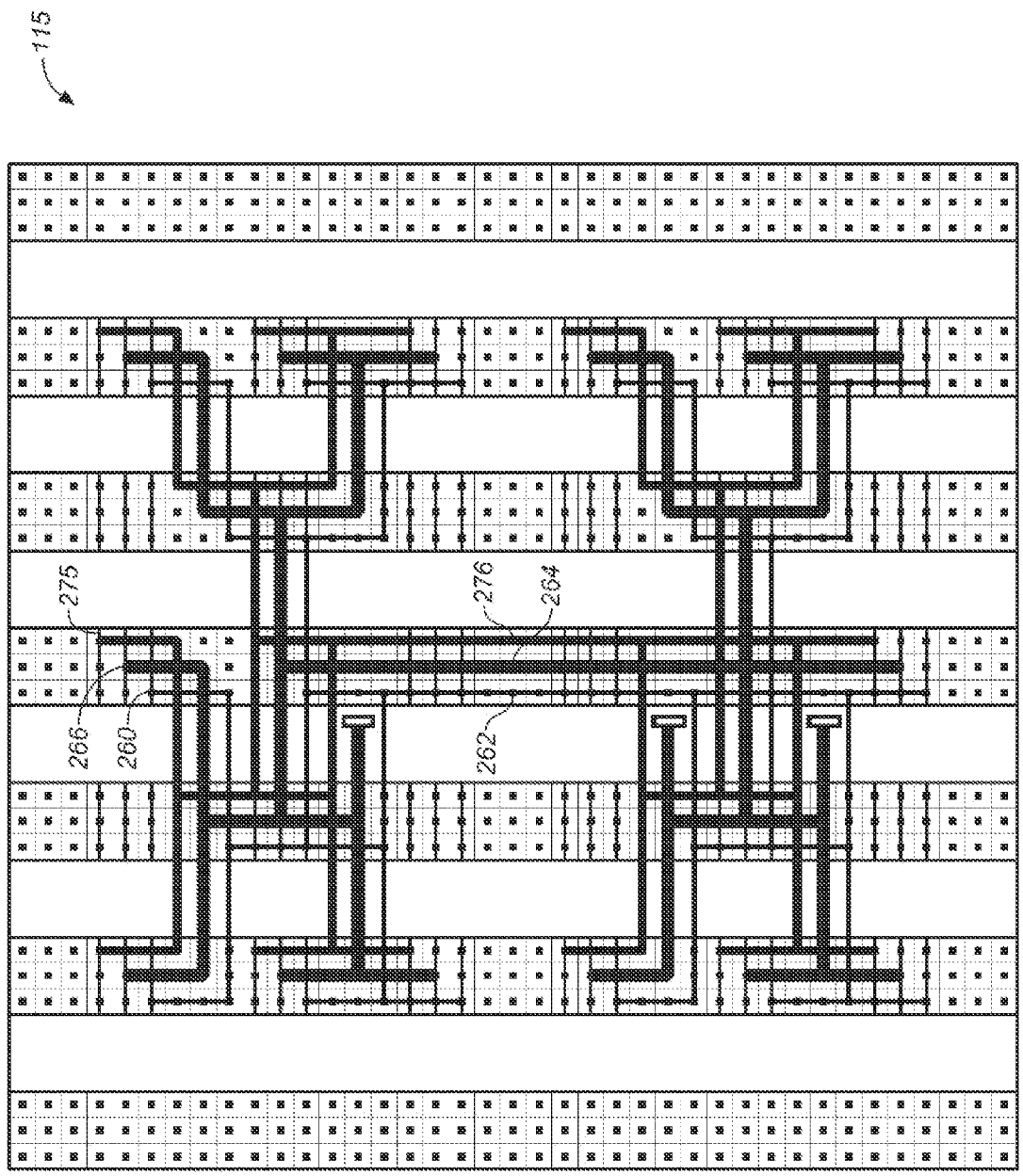
FIG. 2E is a schematic of three global clock trees generated according to the present invention.

The present invention preferably requires that the BRAM columns 110 be an even number, as shown in FIGS. 2C, 2D and 2E, with six or eight columns shown. The global clocks networks are instantiated in the Structured ASIC of the present invention by customizing in a preferred embodiment a single via layer situated between two metal layers (e.g., M3/M4 or $Mi/M_{i+1}$).

As shown in FIG. 2E, using a sample global tree structure, for the given chip dimensions, thirty-six different global clock networks can be generated by the following procedure. One preferred procedure is to first create eight additional global tree structures. Taking the first clock network 260 as given, which is shown by the lightly drawn solid line, eight additional global tree structures are created by shifting the root of the first clock network structure, first tree root node 262 which is usually at the geometric center of the tree, from one eMotif module (a logic cell module 203 shown in FIG. 6, with a clock macro as taught by the present invention in the center of the module) to a neighborhood eMotif module, such as creating a second tree root 264 for the second clock network 266, shown with a darker thickest line in FIG. 2E, displaced in this example from the first tree root node 262 by the width of one eMotif cell width up in the north direction and one eMotif cell width over in the east direction. Likewise, all the branches and leaf nodes of the first clock network 260 are shifted up one cell and over one cell to form the branches and leaf nodes of the second clock tree network, which are then connected to the underlying low-level mesh as further described in connection with FIG. 3. Similarly, to form the third clock network 275, the second tree root 264 is shifted up one and over to the right, to form the third tree root 276, shown with an intermediate thick line, and the corresponding branches and leaf modes of the third clock network are shifted up and over one eMotif cell and the branches connected to the low-level mesh. Thus a plurality of balanced global clock trees 260, 266, 275 are formed, which are then connected to the low-level clock mesh described in connection with FIG. 3. This procedure can be repeated thirty-six times in the preferred clock network of the present invention, given a preferred chip size. It is understood that the clock network of the present invention can create a regional balanced clock tree anywhere in the Structured ASIC, not just in the center of the chip.

Using each of the above tree structures one can generate a plurality of global balanced clock trees by assigning the corresponding routing tracks for each tree branch and connecting consecutive tree branches by the corresponding eMotif Clock Macro instances. The clock tree root is connected to the clock source using any available free resources of the clock routing channels. All clock tree segments are routed with double-shielding and triple-spacing, to minimize errors.

Figure 3B:
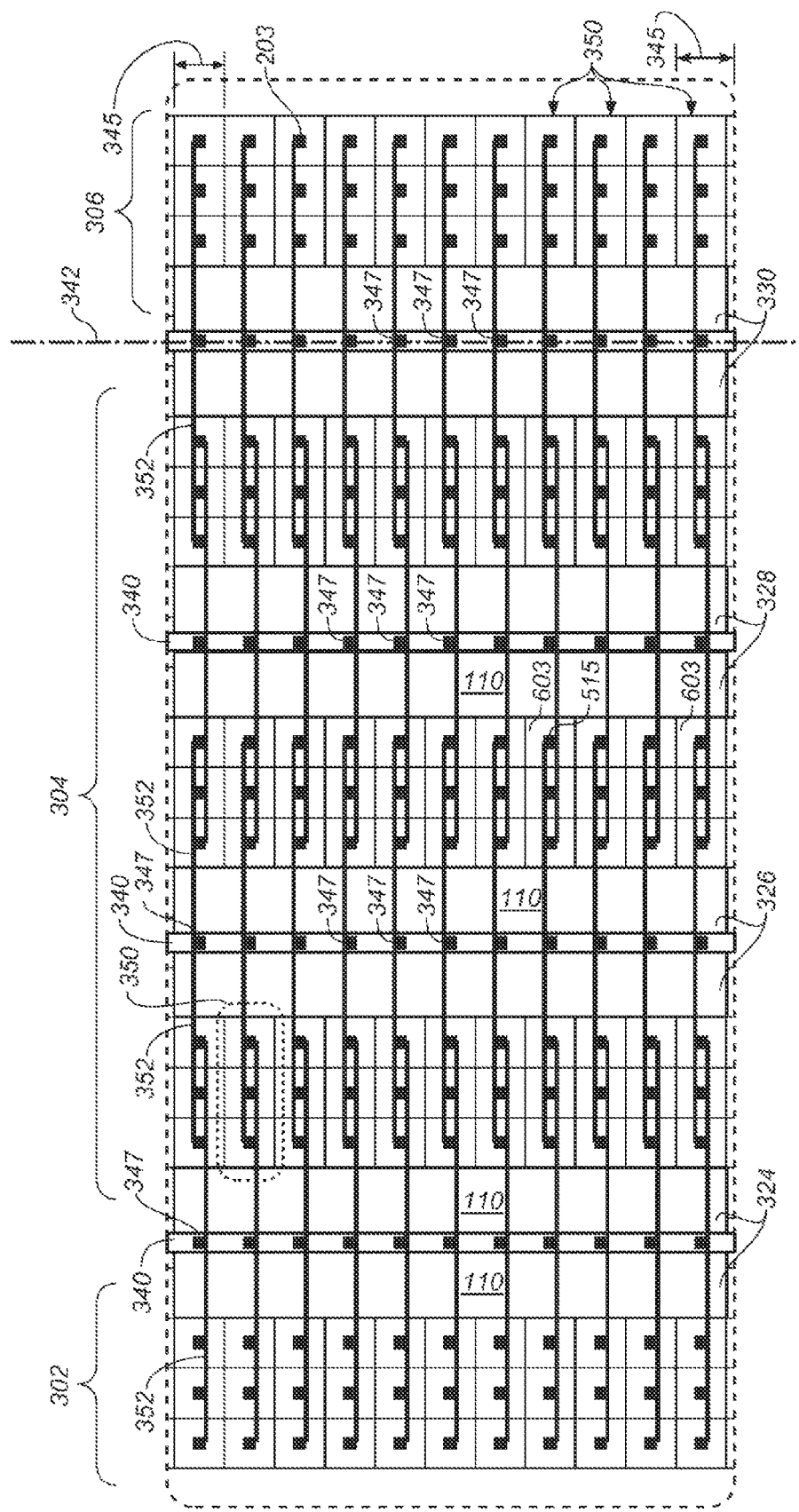
FIG. 3B is a close-up portion of FIG. 3A that shows the low level clock mesh for the clock network of the present invention, showing the characteristic "fishbone" design for providing clock signals to the logic and memory of the core of the present invention.
Figure 6:
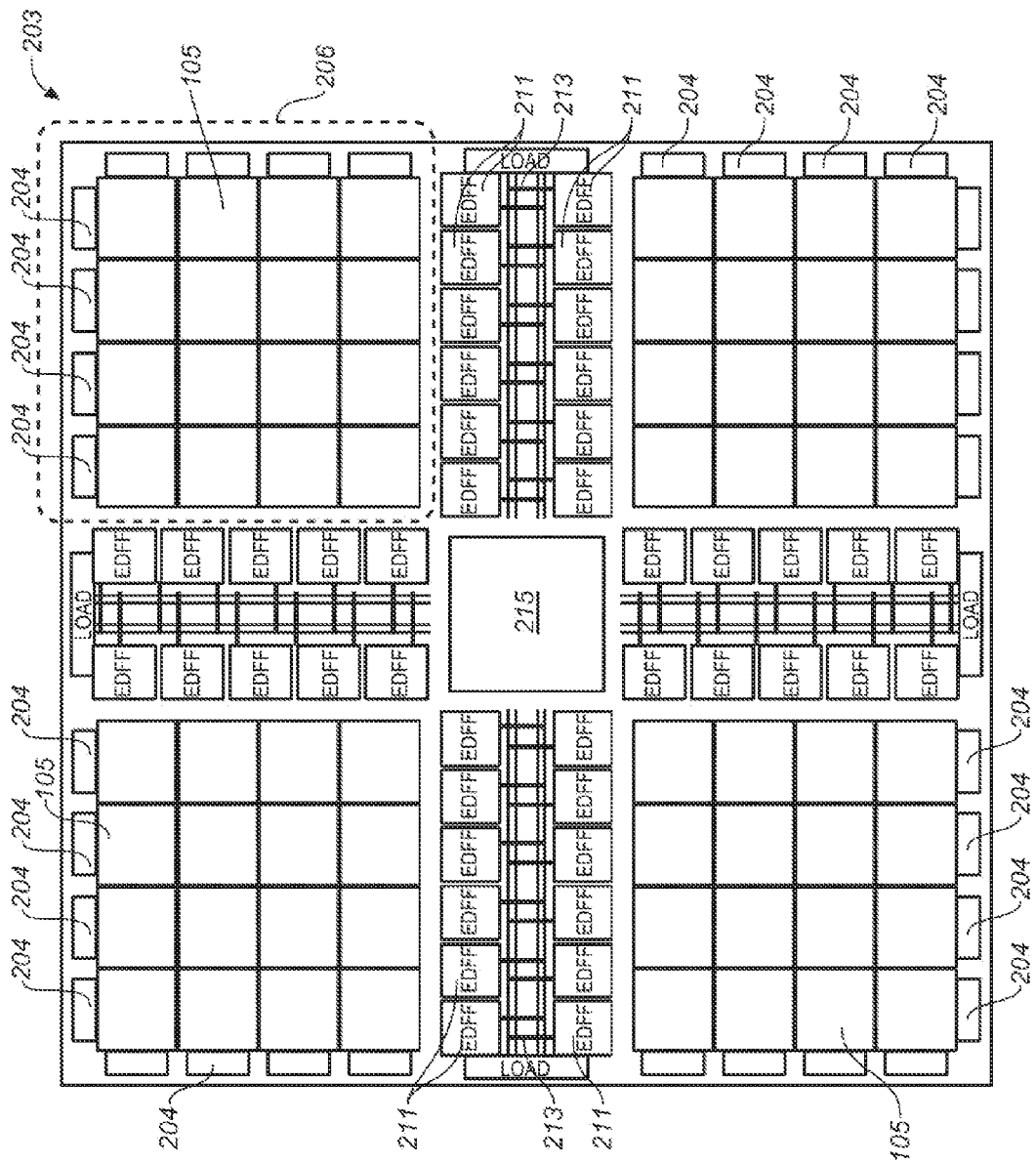
FIG. 6 shows the logic module layout employing the clock macro of FIG. 5.

Turning attention to FIGS. 3A and 3B there are shown a schematic of the low-level clock mesh routing for the clock tree in the core 115 of the Structured ASIC of the present invention. A core 115 is shown with substantially square shaped logic cell block modules 203, called eMotif modules, comprised, inter alia, of a clock macro surrounded by flip-flops and logic cells 105, as best shown in FIG. 6. As shown in FIG. 3B, the core 115 is grouped into regions comprising left peripheral eMotif group area 302, center or core eMotif group area 304 and right peripheral eMotif group area 306, separated by memory cells 110. As shown in FIG. 3A, the eMotif logic cell modules 203 are grouped in columns 313, 316, 318, 320, 321 running vertically north-south along the core 115, and are divided by memory columns 110 also running vertically, and shown left to right as memory columns blocks 324, 326, 328 and 330. The eMotif groups 316, 318, 320 form one of three eMotif "core region" groups, the central group area 304, so-called because three logic regions of the central group are bounded on both their sides by memory blocks 324, 326, 328, 330 as shown.

As shown more clearly in FIG. 3B, which is a close-up of a section shown in FIG. 3A, each of the memory blocks 324, 326, 328, 330 are actually split into two in the layout, as shown, and each have a via channel 340 running up the middle of the memory block, bifurcating the memory block, running north-south vertically in the plane of the paper. This channel is where clock via lines surface (normal to the plane of the paper), at node points 347, and define this channel; the via channel 340 is defined by the channel portion in the plane that contains the plurality of via nodes 347 that extend in a north-south direction. At the left of the core 115 there is a left peripheral eMotif group area 302 and on the right of the core 115 there is right peripheral eMotif group area 306; these are areas, as can be seen, that are not bounded on both sides by columns of BRAM memory blocks. Because four memory cell columns 324, 326, 328, 330 are present, there are three core eMotif group areas 302, 304, 306 or if N memory columns are present, where N is an integer 2 or more, then there will be N−1 core eMotif groups, each core eMotif group located between two neighboring BRAM columns.

As shown in FIG. 3B, at the center line 342 running up the middle of each memory block 110 there is a via channel 340 in each memory block, such as the four blocks shown in FIG. 3A, memory blocks 324, 326, 328, 330. The vias form vertical buses or channels with underlying or overlying metal layers to the layer housing the logic 203 and memory 110, e.g. a vertical bus going to metal layers 7/8, and the longitudinal length of the via channels is substantially orthogonal to the plane of the layer housing the logic 203 and memory 110, i.e., the plane of the core 115. All vertical bus segments that deliver the global clock tree are routed with double-shielding and triple-spacing and each segment occupies five routing tracks, for a total of 32 different vertical buses over each BRAM column 110. Thus for each node 347, there is a structure serviced by that node, either comprising logic or memory, such as a memory block in memory block 110 or a clock macro in eMotif logic cell module 203, and there are 36 vias, the length of the channel defined by the vias running perpendicular out of the plane of the paper in FIGS. 3A and 3B, perpendicular to the line 342 running north-south and perpendicular to the plane the core 115 lies on. Thus every distance identified by a vertical height 345 of a cell, there are, in a preferred embodiment, 36 vias that route to global clocks connected through these vias. In this way any logic cell module 203 or memory cell 110 lying along a horizontal row 350 to this via node 347 can have access to a plurality of these 36 global clocks; in practice, as explained further herein, only 4 to 8 clocks are selected for each eMotif sub-row or row 350 in the core 115.

The clocks may come from a plurality of sources such as a PLL, IO (e.g., an external clock signal), DLL or other logic. In addition, each node 347 has 16 buffers for buffering signals, but in generally any number of buffers may be used. Further, in a preferred embodiment the memory 110 in each column is broken into chunks (not shown) that allows three rows 350 of logic on either side of the memory chunk to access each chunk of memory, though in general any sort of partition is possible and not limited to three rows.

Once a balanced global clock tree is constructed as shown by FIGS. 2C and/or 2D, representing global clocks from a geometrically balanced global clock tree as per FIG. 2A and an electrically equivalent balanced tree global clock tree as per FIG. 2B, respectively, the clock signal from the global clock, which may originate on a different layer and is connected to and travels through the vias found in nodes 347 running up through channel 340, perpendicular to the plane of the paper, has to be distributed throughout the core 115. To this end, in the present invention this distribution is done with a "fishbone"-shaped low-level clock mesh. The clock signals emanate from the plurality of vias that extend vertically out of the plane of the paper in FIGS. 3A, 3B and are shown disposed along the via channel 340 which is coplanar with the plane of core 115. The node points 347 are the points at which the vias extending from an overlying or underlying layer to the layer of the plane of the core 115 come out of the plane of the paper. Collectively in the plane housing core 115 these via node points 347 extend in the north-south directions, e.g., along the via bus line 342 of via channel 340, with the via channel bus extending along the vertical north-south axis of the core 115, parallel to the memory blocks and logic cells modules forming vertical columns as shown, and in-between the memory block columns, as discussed. In a preferred embodiment there are thirty-six vias at each node 347 with the nodes 347 from neighboring vertical columns having conducting paths running along in an east-west direction and forming horizontal rows 350. A designer may operative connect the different rows of these conducting paths of the clock mesh if need be at any metal layer. The number of rows 350 are scalable, and can be any integer number, but for load balancing purposes the preferred integer is 6N+3, where N=an integer greater than 1.

The clock signal from the thirty-six vias is distributed in a fishbone structure 360 having a repeating pattern as best shown in FIGS. 3B and 3C, defined by a vertical spine at via channel 340 containing the via nodes 347 as a sort of vertebrae in the spine, and having conducting paths 352 radiating at a substantial right angle thereto, the paths forming a plurality of horizontal bones along rows 350, and forming clock signal traces or conducting paths or lines 352 (each of these paths 352 may in turn have up to eight individual separate paths within them, as explained further herein). Each of these conducting paths 352 makes its way to the clock macro 215 found at the center each eMotif logic cell modules 203 (the center best shown in FIG. 6) and as shown in FIG. 3B, the eMotif modules 203 disposed along the horizontal rows 350. This fishbone structure 360 forms the low level clock mesh for the clock network of the present invention and comprises the clock signal traces 352 on the plurality of horizontal rows 350 and vertical via channel bus lines 340 to give a rectilinear grid as shown. The clock signal travels from the vertical vias from the vertical via channel bus lines 340 to buffers at node 347, then along the row 350 that contains the eMotif logic cell modules 203. There are 16 buffers inside each node 347. The clock signal then travels along conductive paths, tracks, clock signal lines, clock signal traces or traces 352, along row 350 that extends horizontally, the traces generally made of metal. When the rows 350 are connected to adjacent and/or other rows, for example through the global clock tree that is superimposed on the chip layer (or underneath it, as the case may be), the rows form a low-level mesh that extends in a grid-like manner throughout the core 115 on the chip layer. Thus the fishbone-like architecture of the present structured ASIC, having been preconfigured to be balanced, can help achieve timing closure for any circuit design potentially much faster than if the clock had to be constructed from scratch as in a traditional ASIC.

Furthermore, in a preferred embodiment, every row of the low-level clock mesh does not have to stand alone independent of the other rows but can service in a hierarchical manner the two lower rows beneath it, hence the clock mesh in row 1, the first row, can interact with and service rows two and three below it, row four services rows five and six beneath it, and so forth down for as many rows as desired subject to the limit the rows for load balancing purposes are an integer multiple of 6N+3, where N=an integer greater than 1.

In a preferred embodiment, as shown in FIG. 3B, the memory in memory columns 324, 326, 328, 330 are broken into vertical chucks so that every chuck of BRAM memory in the columns of memory are connected to three rows of logic cells to the right and/or left of the memory chunk, as shown, so that the traces between memory and logic may be straight horizontal lines, without any bends or corners, in order to make for a uniform fabric.

As can be appreciated by one of ordinary skill, not all nodes of the fishbone have to be utilized in a design involving the clock architecture of the present invention, nor do all thirty-six global clocks have to be used, but they are a feature present in the Structured ASIC incorporating the clock architecture of the present invention, a feature that depends on the size of the chip 100.

As best shown in FIG. 3B, the horizontal clock signal lines 352 in each row 350 each comprise eight separate clock signal lines (not shown, due to crowding, as separate lines but as a single line 352) running in parallel to each other, thus for each eMotif cell module 203 in the core eMotif group areas 304, the eMotif cell modules can receive distinct 16 clock signals (eight clock signal lines from the left or west directions and eight from the right or east direction), while in the left and right peripheral eMotif group areas only eight clock signals can be received (from the east and west directions, respectively), since only one line 352 extends to these peripheral eMotif cells. While eight clock signals may be received by the eMotif cells modules 203, presently there is a restriction that only four clock signals are used within the eMotif cells, however in general any number of clocks up to the maximum of eight may be used. Similarly, the BRAM memory cells can receive clock signals from the clock present in clock signal lines 352.

Figure 4:
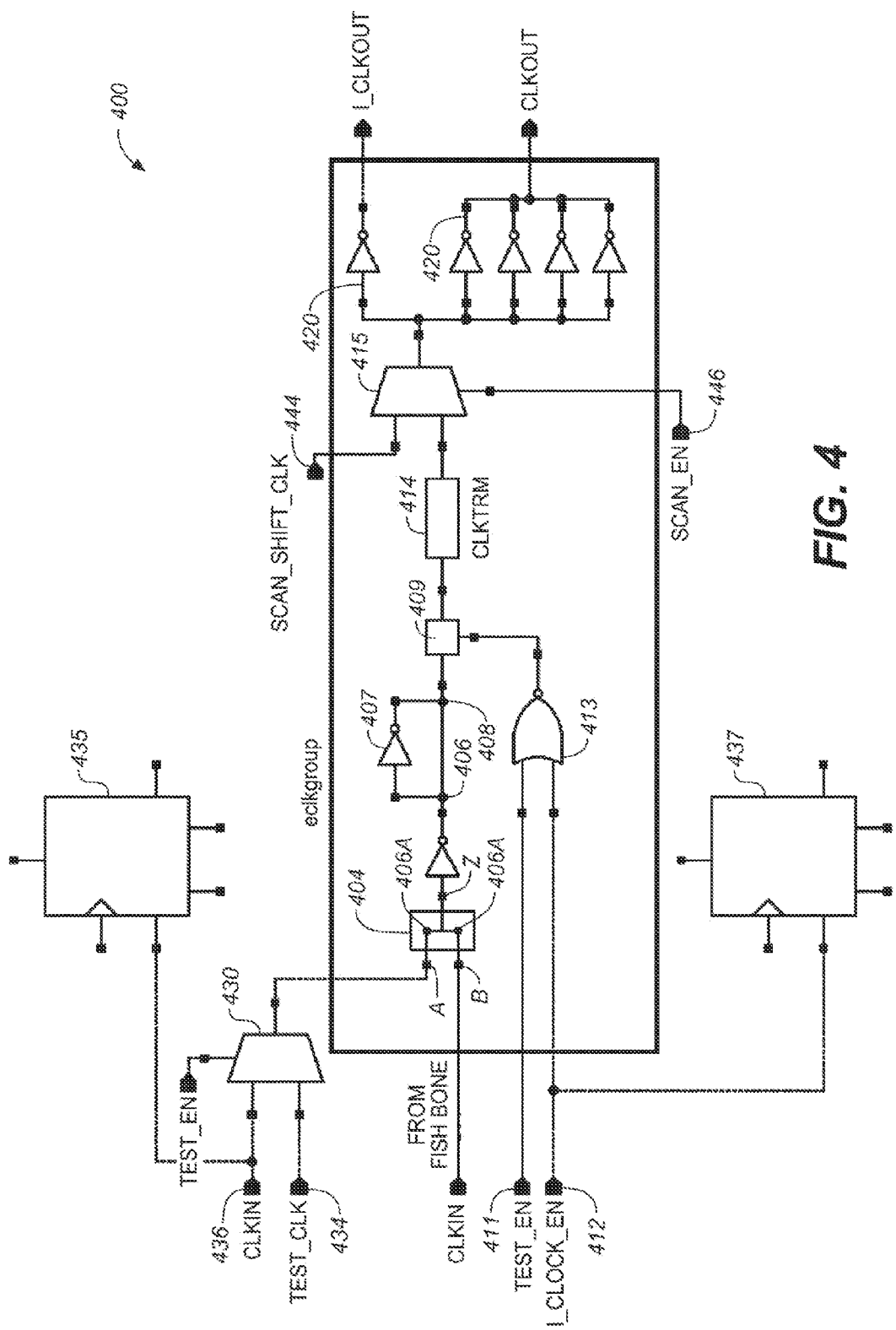
FIG. 4 shows a schematic for a clock macro designed to provide clock signals from a low-level clock mesh to logic cells in the Structured ASIC of the present invention.

Turning attention now to FIG. 4, the figure shows a clock macro schematic for a logic portion 400 of the clock macro 215 designed to provide clock signals from a low-level clock mesh to logic cells in the Structured ASIC. The clock macro logic portion 400 of FIG. 4 appears inside each clock macro 215, which in turn appears inside of each eMotif cell module 203.

The clock macro of FIG. 4 is designed to handle several types of clocks and clock modes: (1) a straight clock for normal clocking operations involving random logic in an eMotif cell module 203; (2) a inverted clock for inverting a clock signal; (3) a delayed clock for delaying a clock signal; (4) a clock gating to enable/disable a clock for completely turning on and off a clock, e.g. to save power consumption (5) a switch for a user selecting between a global and a local clock to access the random logic within eMotif cell module 203; and, (6) a test mode.

To select between a local clock and a global clock, a via-programmable mechanical switch 404 (which can be termed "PVMUX") is shown, which has two vias, one of which may be filled, such as via 406A shown in FIG. 4, which when filled will close the circuit path and select input A, which goes to a local clock, or via 406B, which when filled will select input B, which goes to a global clock. Selecting either of these vias and filling it will connect either of these two inputs A or B to the output Z. Other electronic means to select between the two inputs A, B may be used, such as a 2×1 mux in lieu of a mechanical switch.

To select between an inverted clock signal and a normal clock signal, certain vias at node 406 may be filled to divert a clock signal from passing straight through points 406 to 408, as it would for a normal clock signal, and instead to pass the clock signal from the point 406 to travel through inverter 407 and then to point 408.

At block 409, a clock gate exists, which may be set by a NOR gate 413 which takes as inputs two signal lines 411, 412, such as a test enable and clock enable signal lines. Through this way the clock macro may be suitable enabled or disabled to turn the clock on or off, e.g., for power consumption savings.

At block 414 (labeled "CLKTRM"), clock trim may be employed for clock timing and useful skew purposes, where delay may be purposely introduced to a clock signal by filling in vias on a delay line, as is known per se in the art.

A mux 415 exists for selecting between modes for testing and non-testing, and the output of the clock macro 400, after passing through inverters 420, is output to the flip-flops comprising the eMotif cell module 203, as shown in FIG. 6.

Figure 5:
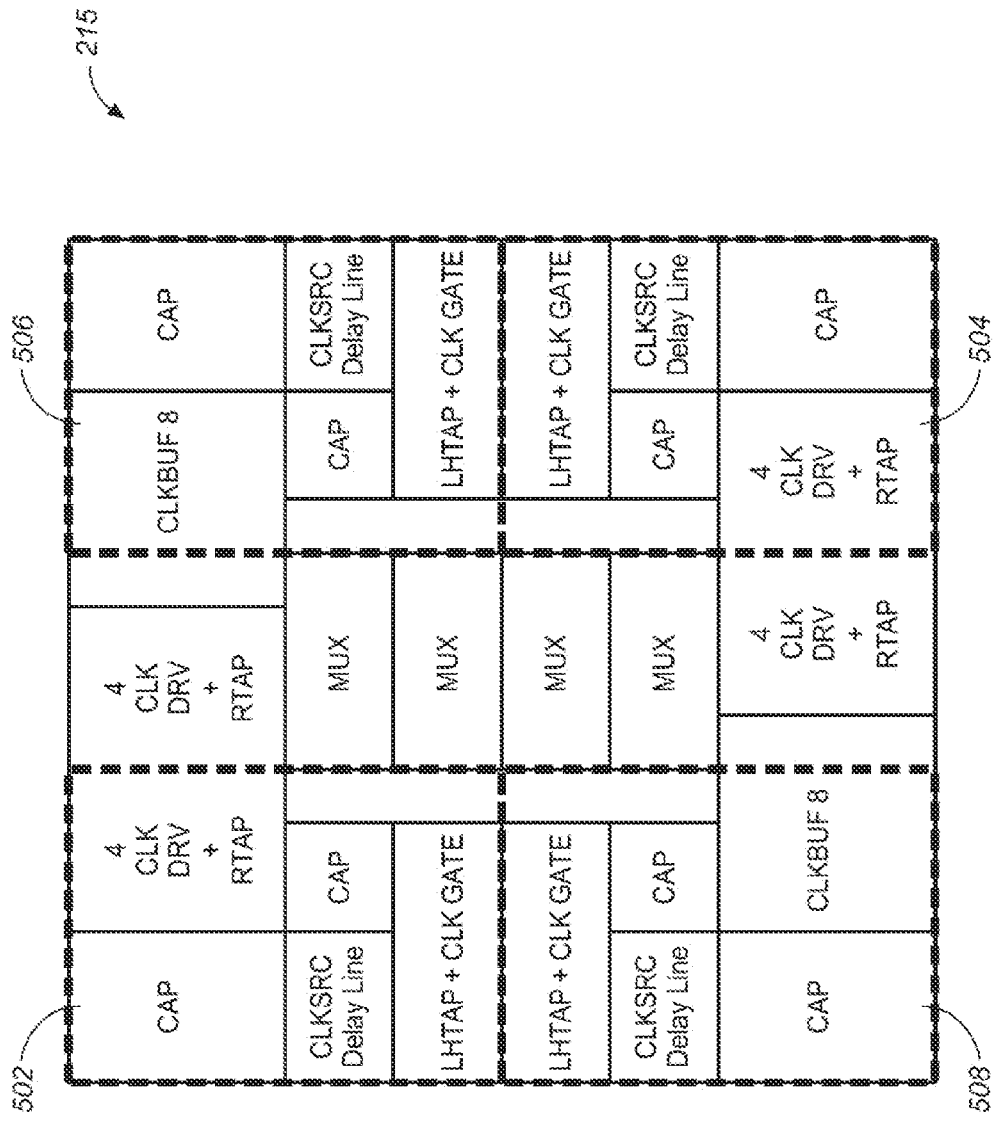
FIG. 5 is a floorplan layout for the clock macro that services logic in the Structured ASIC.

Thus the clock macro of FIG. 4 and as laid out in FIG. 5 can drive clock tree branches as well as provide selected clock signals received from the low-level clock mesh to the eMotif random logic, flip-flops and memory (BRAM). In the schematic of FIG. 4 or 5, the written indicia refers to the following: LHTAP—clock macro input buffer; CLKIN—clock input; TEST_CLK—test clock input; CLKGATE—clock gate; CLKTRM—clock trim, a via-configurable delay element; MUX—for selection between a functional clock and scan-shift clock; CLKDRV—output clock buffer that drives eDFF (data flip-flops) or bRAM (memory) directly; RTAP—output clock buffer that could be connected to the random logic; CLKBUF—contains high drive-strength inverters that drive clock tree branches, but is not connected to the other macros inside the clock macro.

In FIG. 4 test signals are sent through signal line 434 TEST_CLK and selected by a mux 430 when the line TEST_EN is set to 1, and a so-called observation flop 435 stores values associated with the user signal line 436; likewise observation flop 437 stores values coming from user input line 412, with both flops connected to a scan-scan to be analyzed later. Mux 415 likewise is for enabling a scan chain test to be operatively connected to the random logic and flops driven by the clock macro 400. Typically when a scan enable pin such as pin 446 is enabled, certain flip-flops in the eMotif cell module can be connected into a long shift register. Clock signals such as at scan shift clock 444 can be used to control these flip-flops in a chain. This is done in the clock macro of the FIG. 4 schematic, through a scan shift clock line 444, whenever scan enable line 446 is enabled, with the scan chain testing the random logic associated with the eMotif being tested in a sequential fashion using a series of clock signal pulses, as is known per se.

Turning attention again now to FIG. 5, there is shown the floorplan of the clock macro 215 of the eMotif cell module 203. The clock macro of FIG. 5 is substantially symmetrical about the north-south and east-west axis, showing a mirror symmetry with clock macro quadrant 502 in the northwest corner of the clock macro 215 mirroring clock macro quadrant 504 in the southeast corner, and the clock macro quadrant 506 in the northeast corner of the clock macro mirroring clock macro quadrant 508 in the southwest corner of the clock macro 215, and the top (at "4 CLK DRV+RTAP" and two muxes) mirroring the blocks at the bottom about the east-west horizontal line. This symmetry is the reason in a preferred embodiment disclosed herein there are four clocks rather than more clocks as is possible. However, as can be appreciated from one of ordinary skill in the art from the teachings herein, modifying the clock macro to have more than four portions can add more clocks to service the eMotif logic cells of the Structured ASIC.

Each eMotif clock macro 215 in FIG. 5 contains sixteen clock buffers and four "e-clock groups" (of the kind shown in FIG. 4). A single "e-clock groups" block is as shown and described in connection with FIG. 4. In FIG. 5, the layout is as shown: four clock drivers and an output clock buffer RTAP that may be connected to random logic ("4 CLK DRV+RTAP"), a CAP (capacitor), a clock source and delay line ("CLKSRC Delay Line"), eight clock buffers ("CLKBUF 8") and a clock macro input buffer and clock gate ("LHTAP+CLK GATE").

Thus each quadrant in clock macro 215 has areas for a capacitor ("CAP"); four clock drivers and RTAP logic, which is an output clock buffer that can be connected to random logic and drivers to drive the output signal of the clock; "CLKSRC Delay Line" which is the portion of the macro reserved for a clock input source and for introducing delay using conductive paths that are lengthened or shortened using vias and/or other techniques for useful skew in a clock; "LHTAP+CLK GATE" which is the portion of the macro that has the clock macro input buffer and the clock gate (e.g., where enabling the clock gate allows a signal to come in, and setting the enable to zero will turn off the clock dynamic power consumption for power savings). In the center of the clock macro 215, there are four areas ("MUX"), for activities such as selection between a functional clock mode and a scan-shift clock mode, the former for normal operation of the clock and the latter being used for scan-shift testing.

FIG. 6 shows the logic floor plan layout for the eMotif eCELL Matrix module 203 that incorporates the clock macro of FIG. 5 at its center, at block 215, in the logic cell module of the Structured ASIC of the present invention. The clock macro 215 is situated in the center of a logic cell array termed an eMotif eCell matrix 203 tiled with four four-by-four pattern blocks 206, in each corner of the eMotif eCELL Matrix 203, for a total of 64 logic cell blocks 105. Each logic cell 105 in eMotif eCELL Matrix 203 has customizable logic configured as a CLB, VCLB, and/or transistor logic, preferably using transistors that are connected to one another by vias, with the vias either already set as from a library or configurable by the user or customer of the Structured ASIC chip 100, and the configurable vias residing preferably on a single via layer, e.g. as per the references commonly assigned to the assignee of the present invention and incorporated by reference herein mentioned above. The Structured ASIC chip 100 of the present invention has eight signal metal layer (M1-M8, with metal layer M3 being customizable or via configurable by the customer of the Structured ASIC and the others being fixed prior to customization by the customer), and in one preferred embodiment has three metal layers M9/M10/M11 for power distribution. Eight full adders 204 surround each four-by-four block 206 of tiled pattern of logic blocks 105 of the eMotif eCELL Matrix 203, as shown. There are 32 full adders 204 for each eMotif eCELL Matrix 203, and there are 64 such logic blocks 105 in four blocks 206 for each eMotif eCELL Matrix 203 as shown. Full adders are often used in addition and complex multiplication of the kind performed by communications ASICs and in multiplexers. Thus the full adders 204 can be embedded inside the cells 105 rather than outside as shown. The contents of the cells 105 may be any kind of CLB, VCLB, transistor logic and the like. Conventional data flip-flops 211 (termed "eDFF") are present and can be used in registers and to hold state information.

Furthermore the cells 105 may be made of FET transistors manufactured by a CMOS process in the 28 nm or smaller lithographic node and feature sizes corresponding to this node.

Inside the eMotif clock macro, the clock signal lines from line 352 of the fish bones could be connected to the clock input buffer. Optional external routing buffers may also be incorporated into the individual logic cell blocks 105 of the eMotif eCELL Matrix 203 itself to buffer any routing paths in the eMotif eCELL Matrix 203.

In this eMotif eCELL Matrix 203 the clock macro 215 of FIG. 6 is shown in the center of the eMotif eCELL Matrix 203 has routing buffers for efficiently distributing one or more clock signals received from clock trees throughout the chip as well as providing a local clock signal for the eMotif eCELL Matrix 203. The buffers and flip-flops 211 form a distinctive cross shape in the Matrix 203, centered about the clock macro 215. Conductive paths 213 connect the arms of the flip-flops in the cross.

Figure 7:
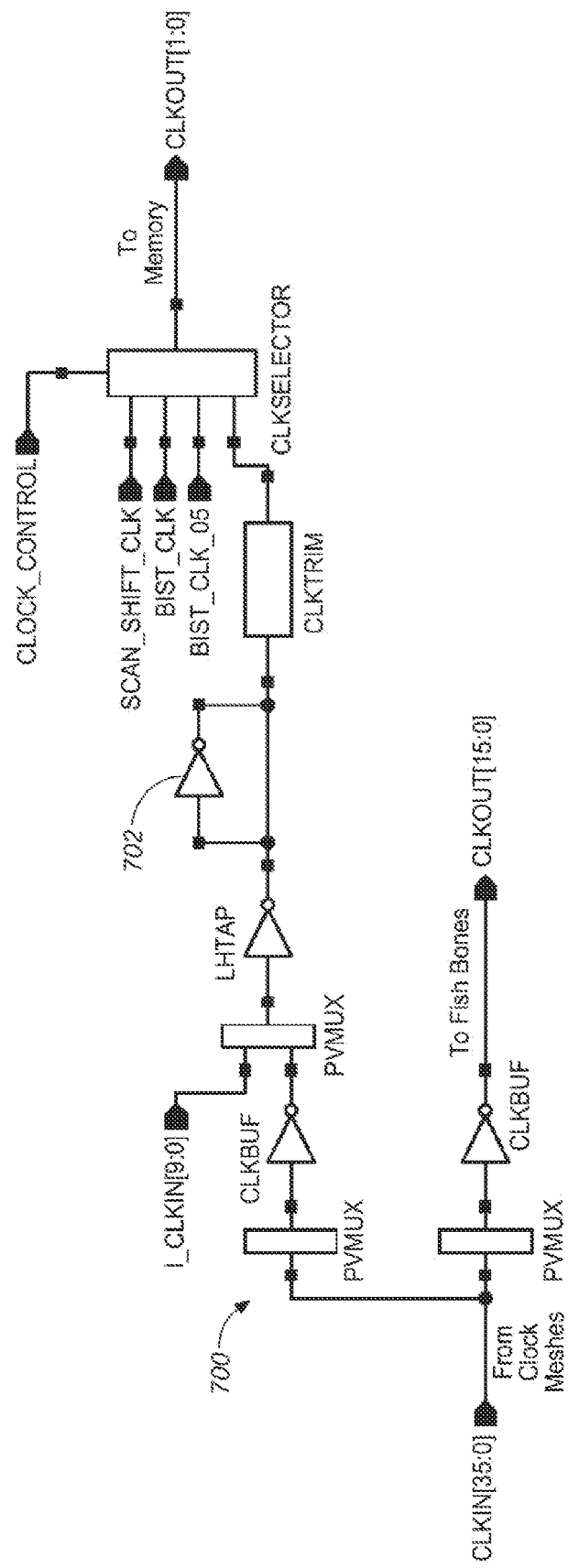
FIG. 7 is a clock macro schematic for a clock macro designed to provide clock signals to memory in the Structured ASIC of the present invention.
Figure 8:
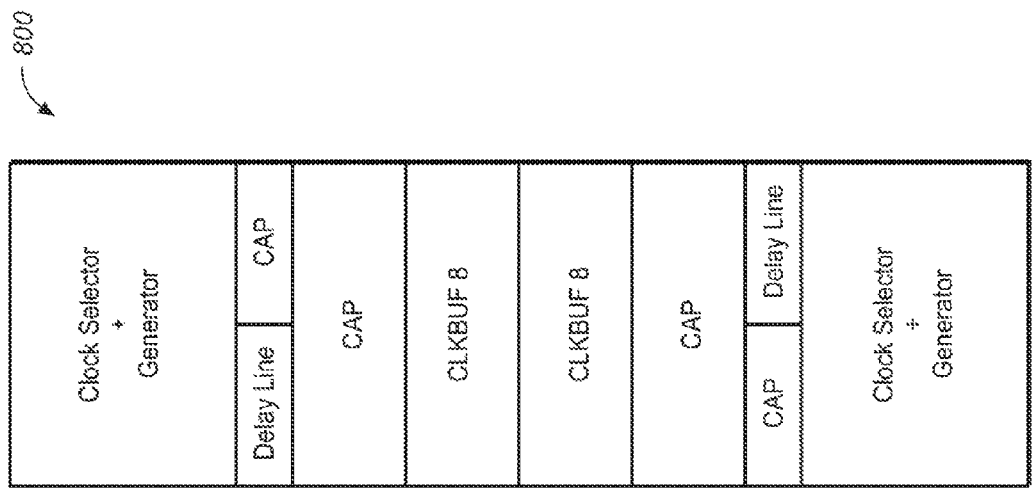
FIG. 8 is a floorplan layout for the clock macro that services memory in the Structured ASIC.

FIGS. 7 and 8 concern schematics and a clock macro floorplan, respectively, for a layout for a clock macro 700 that services memory in the Structured ASIC.

In FIG. 7, analogous to FIG. 4, there exist in the branch 700 a PVMUX, a mechanical switch, a clock buffer (CLKBUF), another PVMUX, a clock macro input buffer (LHTAP), an inverter 702 for inverting the clock signal, a delay line for introducing useful clock delay and skew (CLKTRIM), and various lines to enable in a logic (CLKSELECTOR) various modes that the clock macro 700 for memory can assume, such as test mode (e.g., scan shift, BIST) and regular mode. At input (i.e., "CLKIN[35:0]") an input clock signal can be received from a clock and the signal can be output to either the fishbone low-level clock mesh at the lower path labeled at the output "CLKOUT[15:0]" or to memory, at the upper path labeled at the output "CLKOUT[1:0]", primary for testing the memory 110.

In FIG. 8, the layout for the clock macro 700 for memory is shown. The clock macro is 4 microns wide and has two blocks "Clock selectors and Clock Generator", for selecting between a normal clock and a test-mode clock, and generating a clock signal to convert it to double pumping so that data is transferred on both the rising and falling edges of the clock signal, a "delay line" block (Delay Line) for introducing useful skew, capacitors ("CAP"), and a couple of clock buffers ("CLKBUF 8"). The layout of the above elements is mirror symmetric about a midpoint line drawn in the center of the rectilinear memory clock macro. Presently the clock macro for memory is stored in the BIST logic of the Structured ASIC, but may be stored in the clock memory block itself.

Regarding the present invention, it is important to reiterate that the clock network of the Structured ASIC is providing an infrastructure for a customer to use to build some sort of circuit of value to the customer, primarily through programmable vias. The number of circuits that can be built, and the various interconnections between the elements of the Structured ASIC, including the possible clock trees, is a large set. Thus by definition not every conceivable variation of interconnection that is possible using the architecture of the present invention can be readily described in a single document of reasonable size, but the essential features are described in the present application, as can be appreciated by one of ordinary skill in the art.

Regarding manufacture of the present invention, the via-configurable Structured ASIC of the present invention may be manufactured on a 28 nm CMOS process lithographic node for a planar design and having feature sizes of this dimension or less. The method of manufacturing the ASIC may be as the flow was described herein in connection with an ASIC and/or Structured ASIC. The floorplan of the Structured ASIC of the present invention is manufactured using a CMOS process using NFET/nMOS and PFET/pMOS transistors, which includes a via-configurable logic block (VCLB) architecture. VCLB configuration may be performed by changing properties of so called "configurable vias"—connections between VCLB internal nodes. The configurable vias that are used to customize the chip, and are changed by the customer that deploys the Structured ASIC, is preferably on a single via layer. The floorplan may be constructed on a 2D die using traditional planar IC methods or a 2.5D die using 2.5D IC manufacturing methods. Further one can modify the production process to a 3D process.

Modifications, subtractions and/or additions can be applied by one of ordinary skill from the teachings herein without departing from the scope of the present invention. For example, by doubling all elements in the Structured ASIC, e.g., the vias, buffers and the like, instead of 36 global clocks, one can have 72 global clocks, without departing from the scope of the present invention. Thus the scope of the invention is limited solely by the claims.

It is intended that the scope of the present invention extends to all such modifications and/or additions and that the scope of the present invention is limited solely by the claims set forth below.

We claim:

1. A clock network architecture for a structured application specific integrated circuit (Structured ASIC), comprising:
    a core comprising memory cells and logic cells;
    at least one metal layer in the Structured ASIC;
    the memory cells and the logic cells forming columns in the core;
    a plurality of vias forming conductive paths for clock signals from the metal layer, the vias being substantially perpendicular to the plane containing the core;
    the plurality of vias defining at least one vertical via channel bus line in the core, substantially parallel to and spaced in-between the memory cells and logic cells forming columns in the core;
    clock signal traces that form conductive paths between the vias and the logic cells, the via bus line operatively connected to at least one of the logic cells through the clock signal traces, the clock signal traces extending along at least one horizontal row substantially perpendicular to the vertical via channel bus line; and,
    the vertical via channel bus line and horizontal row of traces forming a clock mesh;
    wherein a clock may be connected to the clock mesh for providing a clock signal to the logic cells of the Structured ASIC.

2. The Structured ASIC according to claim 1, further comprising:
    a plurality of horizontal rows of the clock signal traces;
    a plurality of vias forming vertical via channel bus lines;
    a plurality of clock signal traces in each of the plurality of horizontal rows;
    a global clock tree comprised of a conductive path through which a clock signal may be supplied to the Structured ASIC, the global clock tree operatively connected to the clock mesh; and,
    wherein the horizontal rows of clock signal traces and vertical via channel bus lines forms a clock mesh in the Structured ASIC having a repeating pattern.

3. The Structured ASIC according to claim 2, wherein:
    the columns of memory are an even number.

4. The Structured ASIC according to claim 2, wherein:
    the number of global clock trees is less than or equal to 32 global clock trees;
    a clock macro in each of the logic cells, operatively connected to the clock mesh with one horizontal row of the plurality of horizontal rows of clock signal traces, the clock macro receiving a plurality of clock signal traces from the horizontal row; and,
    the vertical via channel bus lines are disposed on the column of memory cells, in-between the column of memory cells, bifurcating the memory cells.

5. The Structured ASIC according to claim 2, wherein:
    a clock macro for driving the memory cells, operatively connected to the memory cells, the clock macro operatively connected to the global clock tree;
    the clock macro of a rectilinear shape and has a layout for a plurality of elements operatively connected, the layout comprising layout for a clock selector and shaper, layout for a delay line, layout for a capacitor; the clock macro for the memory having the plurality of elements repeat in the clock macro, and, the layout of the plurality of elements repeat in a mirror symmetric manner about a line drawn across the midpoint of the rectilinear shape.

6. The Structured ASIC according to claim 2, further comprising:
a clock macro inside each of the logic cells, operatively connected to the clock mesh and with one horizontal row of the plurality of horizontal rows of clock signal traces, the clock macro receiving a plurality of clock signal traces from the horizontal row.

7. The Structured ASIC according to claim 6, wherein:
the vertical via channel bus lines are disposed on the column of memory cells, in-between the column of memory cells, bifurcating the memory cells.

8. The Structured ASIC according to claim 7, wherein:
the logic cells forming columns in the core form three areas, a central group area, a left peripheral group area and a right peripheral group area, and, the clock macros in the logic cells in the central group area receive the plurality of clock signal traces from both the east and the west directions of the Structured ASIC, the clock macros in the logic cells in the left peripheral group area receive the plurality of clock signal traces from the east direction, and the clock macros in the logic cells in the right peripheral group area receive the plurality of clock signal input traces from the west direction.

9. The Structured ASIC according to claim 7, wherein:
the clock macro is located in the substantially geometric center of each logic cell and has a layout for a plurality of elements operatively connected, the layout comprising layout for a capacitor, layout for a input clock buffer; layout for a delay line; layout for an output clock buffer, layout for the clock gate; and layout for muxes.

10. The Structured ASIC according to claim 7, wherein:
the clock macro is located in the substantially geometric center of each logic cell and has a layout for a plurality of elements operatively connected, the layout comprising layout for a capacitor, layout for a input clock buffer; layout for a delay line; layout for an output clock buffer, layout for the clock gate, and, the layout of the plurality of elements repeat in a mirror symmetric manner within the clock macro.

11. The Structured ASIC according to claim 7, further comprising:
the number of horizontal rows containing the clock signal traces equals 6 N+3, where N=an integer greater than zero;
each logic cell receiving four clock signals from the plurality of clock signal traces;
the memory columns being an even number of memory columns; and,
the Structured ASIC is customized through via-configurable interconnections in the Structured ASIC comprising a single via-metal layer, and the Structured ASIC has feature sizes of 28 nm or smaller and comprises CMOS transistors.

12. A method for constructing a clock network for a programmable Structured ASIC, comprising the steps of:
laying out a Structured ASIC according to the steps of design entry, logic synthesis, system partitioning, floorplanning, placement and routing;
forming in the Structured ASIC a substantially rectangular shaped core;
inserting memory cells and logic cells formed of MOSFET transistors into the core, the memory cells and the logic cells forming columns in the core;
inserting into the Structured ASIC at least one metal layer in the Structured ASIC;
inserting a plurality of vias forming conductive paths for clock signals from the metal layer, the vias being substantially perpendicular to the plane containing the core, the plurality of vias forming at least one vertical via channel bus line in the core, substantially parallel to and spaced in-between the memory cells and logic cells forming columns in the core;
inserting clock signal traces that form conductive paths between the vias and the logic cells, the via bus lines operatively connected to the logic cells with the clock signal traces, the clock signal traces extending along at least one horizontal row substantially perpendicular to the vertical via channel bus line; and,
the vertical via channel bus line and horizontal row of traces forming a clock mesh;
wherein a clock may be connected to the clock mesh for providing a clock signal to the logic cells of the Structured ASIC, and the Structured ASIC is customized through via-configurable interconnections in the Structured ASIC.

13. The method according to claim 12 comprising the steps of:
forming a plurality of horizontal rows of the clock signal traces;
forming a plurality of vertical via channel bus lines;
forming the columns of memory in an even number of columns;
having a plurality of clock signal traces in each of the plurality of horizontal rows;
forming a global clock tree comprised of a conductive path through which a clock signal may be supplied to Structured ASIC, the global clock tree operatively connected to the clock mesh; and,
wherein the horizontal rows of clock signal traces and vertical via channel bus lines forms a substantially repeating pattern grid clock mesh in the Structured ASIC.

14. The method according to claim 13, further comprising the steps of:
forming the number of global clock trees to be less than or equal to 32 global clock trees;
inserting a clock macro in each of the logic cells, operatively connected to the clock mesh with one horizontal row of the plurality of horizontal rows of clock signal traces, the clock macro receiving a plurality of clock signal traces from the horizontal row; and,
forming the vertical via channel bus lines to be disposed on the column of memory cells.

15. The method according to claim 13, further comprising the steps of:
inserting a clock macro for the memory cells, operatively connected to the memory cells;
forming the clock macro into a rectilinear shape layout having within it a layout for a plurality of elements operatively connected, the layout comprising a layout for a clock selector and shaper, a layout for a delay line, a layout for a capacitor;
the clock macro for the memory having the plurality of elements repeat in the clock macro, and, the layout of the plurality of elements repeat in a mirror symmetric manner about a line drawn across the midpoint of the rectilinear shape.

16. The method according to claim 13, further comprising the steps of:

inserting a clock macro into the logic cells, the clock macro is found substantially in the geometric center of each logic cell, and has a layout for a plurality of elements operatively connected, providing areas in the clock macro for the layout of elements, comprising layout for a capacitor, layout for a input clock buffer; layout for a delay line; layout for an output clock buffer, layout for the clock gate;

the plurality of elements repeating in the clock macro, and, the layout of the plurality of elements repeat in a mirror symmetric manner within the clock macro.

17. The method according to claim 16, further comprising the steps of:

forming the logic cells forming columns in the core into three areas, a central group area, a left peripheral group area and a right peripheral group area, and, the clock macros in the logic cells in the central group area receive the plurality of clock signal traces from both the east and the west directions of the Structured ASIC, the clock macros in the logic cells in the left peripheral group area receive the plurality of clock signal traces from the east direction, and the clock macros in the logic cells in the right peripheral group area receive the plurality of clock signal input traces from the west direction.

18. The method according to claim 16, further comprising the steps of:

forming the vertical via channel bus lines to be disposed on the column of memory cells.

19. The method according to claim 18, further comprising the steps of:

forming the number of horizontal rows containing the clock signal traces to equal 6 N+3, where N=an integer greater than zero;

forming four clock signal lines for each logic cell;

forming an even number of memory columns;

forming the Structured ASIC on a 28 nm or smaller CMOS process lithographic node; and, the Structured ASIC is customized through via-configurable interconnections in the Structured ASIC comprising a single via-metal layer.

20. A Structured ASIC comprising:

a core having logic cells and memory cells, the memory cells and the logic cells forming columns in the core, and the columns of memory are an even number;

means for providing a clock signal to said logic cells of the Structured ASIC comprising:

at least one metal layer in the Structured ASIC;

a plurality of vias forming conductive paths for clock signals from the metal layer, the vias being substantially perpendicular to the plane containing the core;

the plurality of vias forming at least one vertical via channel bus line in the core, substantially parallel to and spaced in-between the memory cells and logic cells forming columns in the core;

clock signal traces that form conductive paths between the vias and the logic cells, the via bus lines operatively connected to the logic cells with the clock signal traces, the clock signal traces extending along at least one horizontal row substantially perpendicular to the vertical via channel bus line; and, the vertical via channel bus line and horizontal row of traces forming a repeating pattern clock mesh;

a plurality of horizontal rows of the clock signal traces;

a plurality of vertical via channel bus lines;

a plurality of clock signal traces in each of the plurality of horizontal rows;

a global clock tree comprised of a conductive path through which a clock signal may be supplied to Structured ASIC, the global clock tree operatively connected to the clock mesh;

wherein the horizontal rows of clock signal traces and vertical via channel bus lines forms a substantially rectilinear grid clock mesh in the Structured ASIC;

the number of global clock trees is less than or equal to 32 global clock trees;

a clock macro in each of the logic cells, operatively connected to the clock mesh with one horizontal row of the plurality of horizontal rows of clock signal traces, the clock macro receiving a plurality of clock signal traces from the horizontal row;

the vertical via channel bus lines are disposed on the column of memory cells; and, the logic cells forming columns in the core form three areas, a central group area, a left peripheral group area and a right peripheral group area, and, the clock macros in the logic cells in the central group area receive the plurality of clock signal traces from both the east and the west directions of the Structured ASIC, the clock macros in the logic cells in the left peripheral group area receive the plurality of clock signal traces from the east direction, and the clock macros in the logic cells in the right peripheral group area receive the plurality of clock signal input traces from the west direction;

wherein a clock may be connected to the clock mesh for providing a clock signal to the logic cells of the Structured ASIC.

* * * * *